(12) United States Patent
Kim et al.

(10) Patent No.: US 12,225,742 B2
(45) Date of Patent: Feb. 11, 2025

(54) DETECTION MODULE AND DISPLAY DEVICE HAVING THE SAME

(71) Applicant: Samsung Display Co., Ltd., Yongin-si (KR)

(72) Inventors: Junghak Kim, Hwaseong-si (KR); Youngsik Kim, Yongin-si (KR); Kyowon Ku, Seoul (KR); Jaehyung Jo, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/435,669

(22) Filed: Feb. 7, 2024

(65) Prior Publication Data

US 2024/0250101 A1    Jul. 25, 2024

Related U.S. Application Data

(63) Continuation of application No. 17/147,321, filed on Jan. 12, 2021, now Pat. No. 11,923,390.

(30) Foreign Application Priority Data

Apr. 10, 2020  (KR) ........................ 10-2020-0044289

(51) Int. Cl.
*H01L 27/146* (2006.01)
*G06V 40/13* (2022.01)
*H01L 25/18* (2023.01)

(52) U.S. Cl.
CPC .... *H01L 27/14623* (2013.01); *G06V 40/1318* (2022.01); *H01L 25/18* (2013.01); *H01L 27/14614* (2013.01); *H01L 27/14636* (2013.01)

(58) Field of Classification Search
None
See application file for complete search history.

(56) References Cited

U.S. PATENT DOCUMENTS

| 10,203,816 | B2 | 2/2019 | Nelson et al. |
| 2015/0187959 | A1 | 7/2015 | Yoon |
| 2015/0331508 | A1 | 11/2015 | Nho et al. |
| 2017/0270338 | A1 | 9/2017 | Ding et al. |

(Continued)

FOREIGN PATENT DOCUMENTS

| EP | 3621112 | 3/2020 |
| KR | 10-2015-0080257 | 7/2015 |

(Continued)

OTHER PUBLICATIONS

Non-Final Office Action issued Dec. 22, 2022, in U.S. Appl. No. 17/147,321.

(Continued)

*Primary Examiner* — Michelle Mandala
*Assistant Examiner* — Jordan M Klein
(74) *Attorney, Agent, or Firm* — Lewis Roca Rothgerber Christie LLP

(57) ABSTRACT

According to one aspect of the invention, a detection module for a display device, the detection module includes: a substrate; a detector disposed on the substrate to detect an external signal; a sensor driving circuit disposed on the substrate to drive the detector; and a light shielding layer to block an external light from entering the sensor driving circuit and to receive a light blocking voltage.

21 Claims, 14 Drawing Sheets

(56) References Cited

U.S. PATENT DOCUMENTS

| | | | |
|---|---|---|---|
| 2018/0172591 A1 | 6/2018 | Jun et al. | |
| 2018/0182342 A1 | 6/2018 | Li et al. | |
| 2018/0284927 A1 | 10/2018 | Kim et al. | |
| 2019/0073509 A1* | 3/2019 | Chien | G02F 1/13439 |
| 2019/0172875 A1 | 6/2019 | Kang et al. | |
| 2020/0105850 A1 | 4/2020 | Kang et al. | |
| 2021/0359061 A1* | 11/2021 | Wang | H10K 59/13 |

FOREIGN PATENT DOCUMENTS

| | | |
|---|---|---|
| KR | 10-1772491 | 8/2017 |
| KR | 10-1920826 | 11/2018 |
| KR | 10-2020-0000012 | 1/2020 |

OTHER PUBLICATIONS

Final Office Action issued Jul. 3, 2023, in U.S. Appl. No. 17/147,321.
Notice of Allowance issued Oct. 27, 2023, in U.S. Appl. No. 17/147,321.

* cited by examiner

DETECTION MODULE AND DISPLAY DEVICE HAVING THE SAME

CROSS-REFERENCE TO RELATED APPLICATIONS

This application is a Continuation of U.S. patent application Ser. No. 17/147,321, filed Jan. 12, 2021, which claims priority from and the benefit of Korean Patent Application No. 10-2020-0044289, filed on Apr. 10, 2020, which is hereby incorporated by reference for all purposes as if fully set forth herein.

BACKGROUND

Field

Implementations of the invention relate generally to a display device, and more specifically, to a detection module with improved performance and a display device having the same.

Discussion of the Background

Display devices display an image to provide various functions for communicating organically with a user, such as providing information to a user or detecting a user's input. Recently, display devices may include a function for detecting a user's fingerprint.

Fingerprint recognition methods include a capacitive method for detecting a change in capacitance formed between electrodes, an optical method for detecting the incident light using an optical sensor, and an ultrasonic method for detecting vibration by using a piezoelectric material.

The above information disclosed in this Background section is only for understanding of the background of the inventive concepts, and, therefore, it may contain information that does not constitute prior art.

SUMMARY

Applicant realized that external light entering a display device can deteriorate performance of a detection module (e.g., a fingerprint detection module) included in the display device.

Detection modules and display devices having the same constructed according to the principles and implementations of the invention can prevent performance of the detection module from being deteriorated due to external light. For example, a light shielding layer may block external light from entering a sensor driving circuit to which a light blocking voltage is applied.

Detection modules and display devices having the same constructed according to the principles and implementations of the invention have a light shielding member, such as a light shielding layer, in the sensor unit to reduce the problem of external light increasing the leakage current of a transistor included in the sensor driving circuit of the display device.

In addition, by applying the light blocking voltage to the light shielding layer, it is possible to prevent the potential difference between the control electrode and the input electrode of the transistor from being increased to a certain level or higher due to a hysteresis phenomenon. That is, by preventing the driving performance of the transistor from deteriorating, it is possible to improve the sensing performance and improve the overall reliability of the detection module.

Additional features of the inventive concepts will be set forth in the description which follows, and in part will be apparent from the description, or may be learned by practice of the inventive concepts.

According to one aspect of the invention, a detection module for a display device, the detection module includes: a substrate; a detector disposed on the substrate to detect an external signal; a sensor driving circuit disposed on the substrate to drive the detector; and a light shielding layer to block an external light from entering the sensor driving circuit and to receive a light blocking voltage.

The light shielding layer may be disposed between the substrate and the sensor driving circuit.

The sensor driving circuit may include at least one transistor.

The transistor may include an active layer; a control electrode disposed on the active layer and overlapping the active layer; and an input electrode and an output electrode spaced apart from each other on the control electrode. The light shielding layer may be disposed between the active layer and the substrate.

The transistor may include an active layer; a control electrode disposed under the active layer and overlapping the active layer; an input electrode and an output electrode spaced apart from each other on the active layer. The light shielding layer may be disposed between the control electrode and the substrate.

The light shielding layer may include an opening at least partially overlapping the control electrode.

The detection module may further include a power supply line to supply the light blocking voltage to the light shielding layer, the light blocking voltage being ground voltage or a substantially constant voltage.

The light shielding layer may include a lower light shielding layer disposed between the substrate and the sensor driving circuit; and an upper light shielding layer disposed on the sensor driving circuit.

At least one of the lower light shielding layer and the upper light shielding layer may be configured to receive the light blocking voltage.

The sensor driving circuit may include at least one transistor, wherein the detector overlaps the transistor.

The upper light shielding layer may include an opening part overlapping a position where the output electrode of the transistor and the detection element are connected.

An area of the lower light shielding layer may be larger than an area of the upper light shielding layer.

The detector may include a detection element including a photoelectric conversion element.

The detection module may further include an optical system including a plurality of transmission parts and a light absorbing part provided around the plurality of transmission parts. The detection element may be disposed under the optical system to receive light passing through the plurality of transmission parts.

According to another aspect of the invention, a display device includes: a display module including a light emitting element to generate light, and a display panel to display an image using the light; and a detection module disposed under the display module to receive an external signal. The detection module includes a substrate; a detector disposed on the substrate to detect the external signal; a sensor driving circuit disposed on the substrate to drive the detector; and a light shielding layer to block an external light from entering the sensor driving circuit and to receive a light blocking voltage.

The light shielding layer may be disposed between the substrate and the sensor driving circuit.

The sensor driving circuit may include at least one transistor.

The transistor may include an active layer; a control electrode disposed on the active layer and overlapping the active layer; and an input electrode and an output electrode spaced apart from each other on the control electrode. The light shielding layer may be disposed between the active layer and the substrate.

The transistor may include an active layer; a control electrode disposed under the active layer and overlapping the active layer; an input electrode and an output electrode spaced apart from each other on the control electrode. The light shielding layer may be disposed between the control electrode and the substrate.

The light shielding layer may include: a lower light shielding layer disposed between the substrate and the sensor driving circuit; and an upper light shielding layer disposed on the sensor driving circuit.

The light blocking voltage may be applied to at least one of the lower light shielding layer and the upper light shielding layer.

The sensor driving circuit may include at least one transistor connected to the detector. The upper light shielding layer may include an opening part provided corresponding to a position where the output electrode of the transistor and the detector are connected.

An area of the lower light shielding layer may be larger than an area of the upper light shielding layer.

The detector may include a detection element including a photoelectric conversion element.

The detection module may further include an optical system including a plurality of transmission parts and a light absorbing part provided around the plurality of transmission parts. The detection element and the sensor driving circuit may overlap the plurality of transmission parts.

The light shielding layer comprises a metal material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1A:
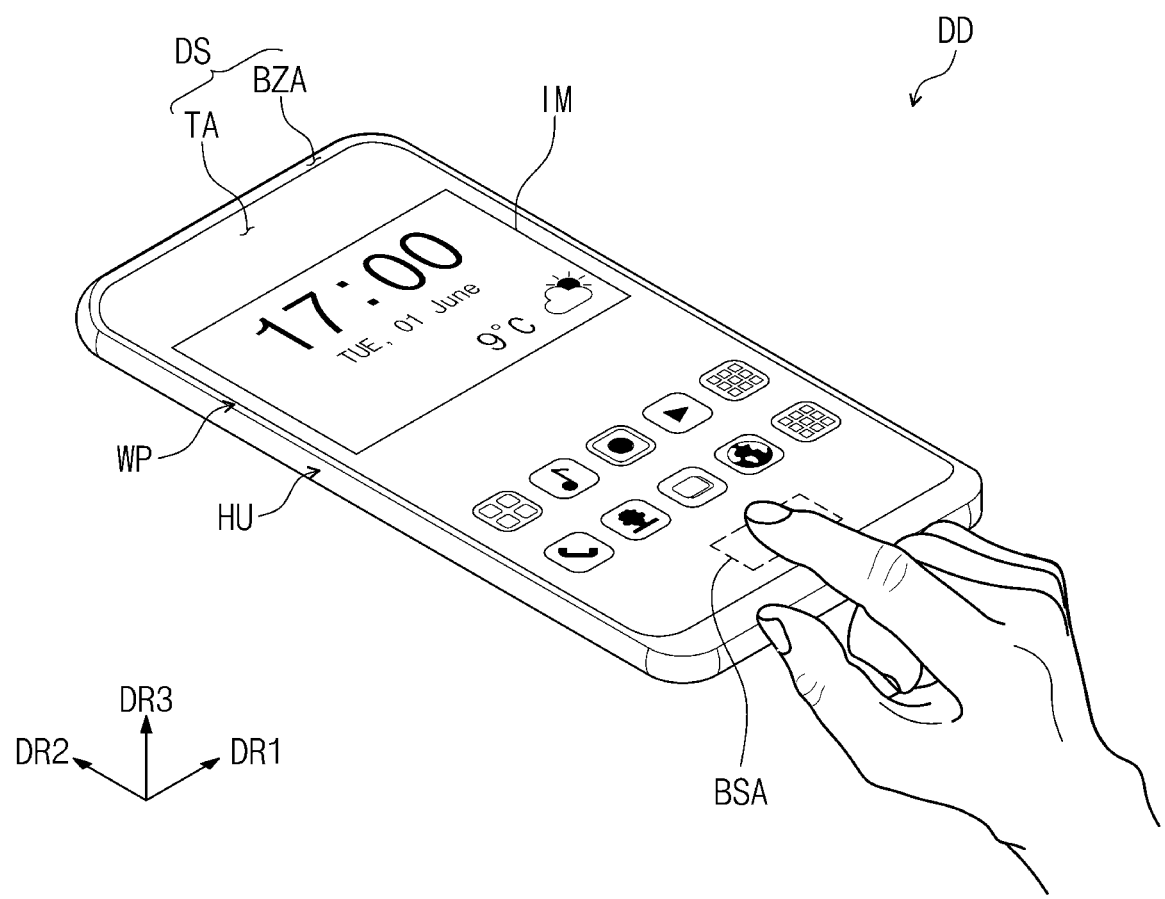
FIG. 1A is a perspective view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
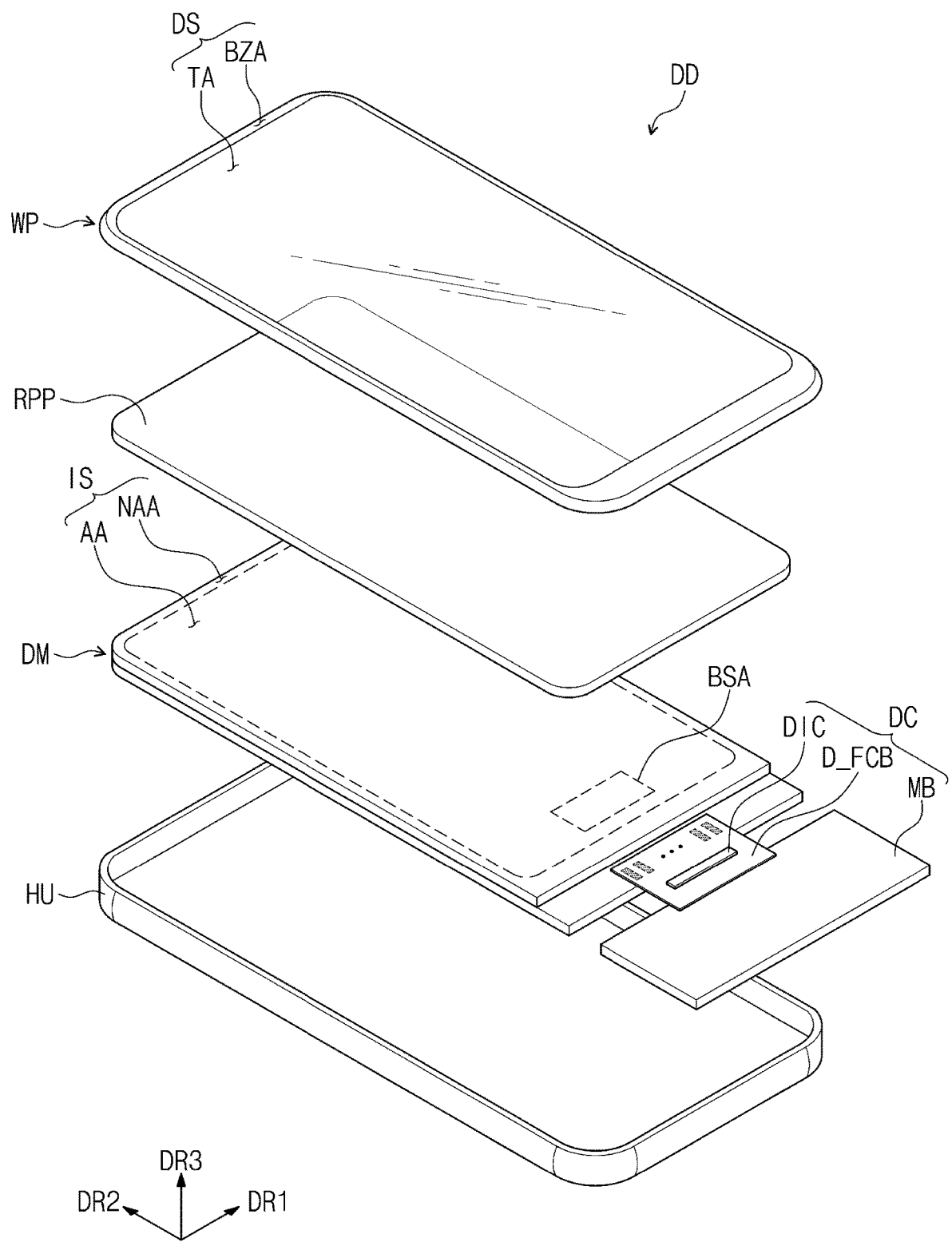
FIG. 1B is an exploded perspective view of the display device of FIG. 1A.
Figure 2:
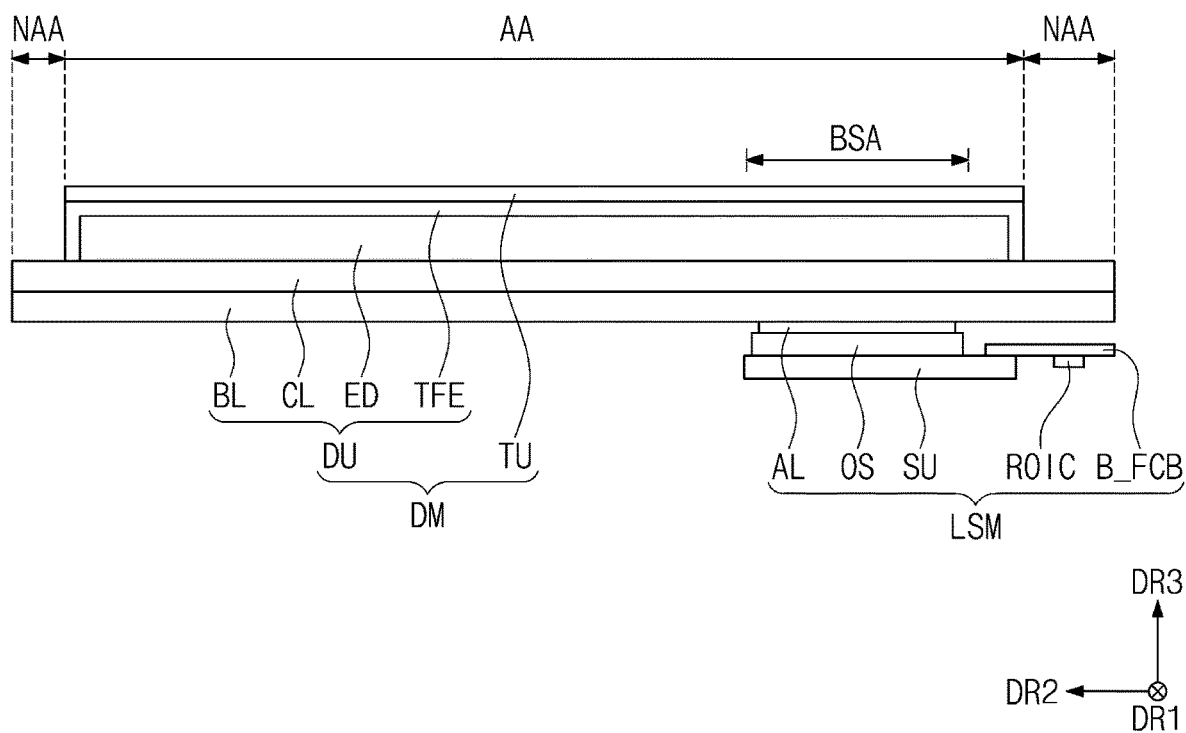
FIG. 2 is a cross-sectional view of an embodiment of a display module and a detection module constructed according to the principles of the invention.
Figure 3:
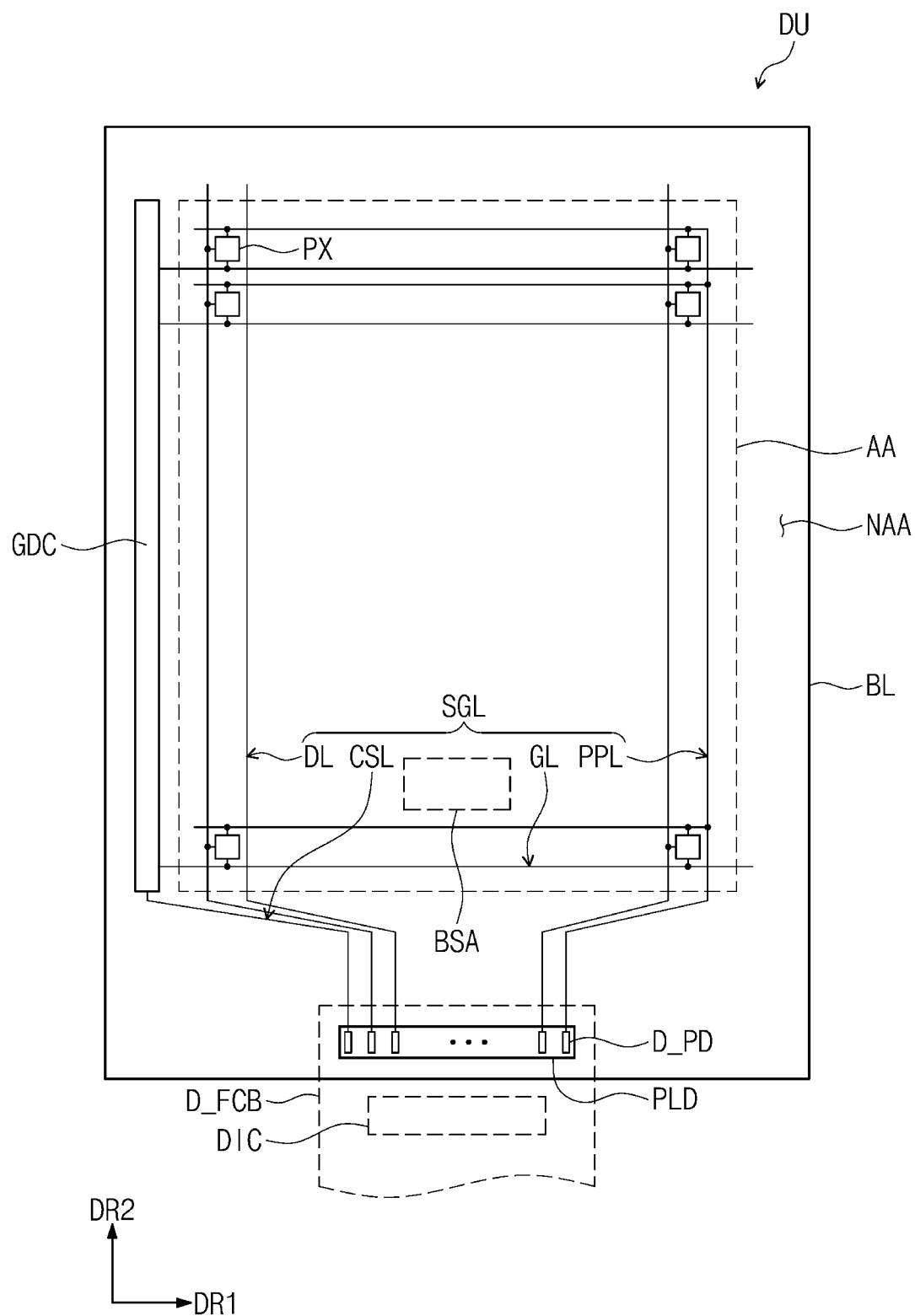
FIG. 3 is a plan view of a display panel in the display module of FIG. 2.

FIG. 1A is a perspective view of an embodiment of a display device constructed according to the principles of the invention, and FIG. 1B is an exploded perspective view of the display device of FIG. 1A. FIG. 2 is a cross-sectional of an embodiment of a display module and a detection module constructed according to the principles of the invention, and FIG. 3 is a plan view of a display panel in the display module of FIG. 2.

Referring to FIGS. 1A and 1B, a display device DD may be a device activated according to an electrical signal. The display device DD may be applied to or take the form of various embodiments. For example, the display device DD may be used in medium-sized electronic devices such as personal computers, notebook computers, personal digital terminals, car navigation units, game machines, portable electronic devices, and cameras in addition to large-sized electronic devices such as televisions, monitors, or external billboards. In addition, these examples are simply suggested as embodiments and it is apparent that display devices may be employed in other electronic devices without departing from the scope of the inventive concept. In this embodiment, the display device DD is illustratively shown as a smart phone.

The display device DD may include a display surface DS parallel to a first direction DR1 and a second direction DR2 and display the image IM toward a third direction DR3 on the display surface DS. The Image IM may include still images as well as dynamic images. In FIG. 1A, a watch window and icons are shown as an example of the image IM. The display surface DS on which the image IM is displayed may correspond to the front surface of the display device DD.

In the illustrated embodiment, the front surface (or upper surface) and the rear surface (or lower surface) of each member are defined with reference to the direction in which the image IM is displayed. The front surface and the rear surface are opposed to each other in the third direction DR3, and the normal direction of each of the front surface and the rear surface may be parallel to the third direction DR3. Moreover, the directions that the first to third directions DR1, DR2, and DR3 indicate may be converted to other directions as a relative concept. In the specification, "when viewed on a plane" may refer to "when viewed in the third direction DR3".

The display device DD may detect a user input applied from the outside. The user input includes various types of external inputs such as a part of the user's body, light, heat, or pressure. In addition, the display device DD may detect the user input applied to the side surface or the rear surface of the display device DD according to the structure of the display device DD, but is not limited to any one embodiment.

The display device DD may detect biometric authentication information of user applied from the outside. A biometric information detection area BSA may be provided on the display surface DS of the display device DD. The biometric information detection area BSA may be provided in the entire area of the transmission area TA, or may be provided in some area of the transmission area TA. That is, FIGS. 1A and 1B show that a biometric information detection area BSA is provided in a part of the transmission area TA but the embodiments are not limited to this structure, and the entire transmission area TA may be utilized as a biometric information detection area BSA. The biometric information detection area BSA is exemplarily illustrated in FIGS. 1A and 1B. However, in addition to the biometric information detection area BSA, various detection areas, such as an area for detecting illuminance and an area for detecting infrared rays, may be provided on the display surface DS of the display device DD.

The display device DD may include a window WP, an anti-reflection panel RPP, a display module DM, and a housing HU. In this embodiment, the window WP and the housing HU are combined to constitute the appearance of the display device DD.

The window WP may include an optically transparent insulating material. For example, the window WP may include glass or plastic. The window WP may have a multi-layer structure or a single-layer structure. For example, the window WP may include a plurality of plastic films bonded together with an adhesive, or may include a glass substrate and a plastic film bonded together with an adhesive.

As described above, a front surface of the window WP defines the display surface DS of the display device DD. The transmission area TA may be an optically transparent area. For example, the transmission area TA may be an area having a visible light transmittance of about 90% or more.

The bezel area BZA may be an area with a lower light transmittance compared to the transmission area TA. The bezel area BZA defines the shape of the transmission area TA. The bezel area BZA is adjacent to the transmission area TA and may surround the transmission area TA.

The bezel area BZA may have a predetermined color. The bezel area BZA covers the peripheral area NAA of the display module DM to prevent the peripheral area NAA from being visually recognized from the outside. On the other hand, this is illustrated by way of example, and in the window WP, the bezel area BZA may be omitted.

The anti-reflection panel RPP may be disposed below the window WP. The anti-reflection panel RPP reduces the reflectance of external light incident from an upper side of the window WP. In an embodiment, the anti-reflection panel RPP may be omitted or may be a configuration included in the display module DM.

The display module DM may display the image IM, detect the user input, and detect biometric authentication information of an user. The display module DM includes a front surface IS including an active area AA and a peripheral area NAA. The active area AA may be an area activated according to an electrical signal.

In the illustrated embodiment, the active area AA may be an area where the image IM is displayed, and at the same time, and may be an area where the external input is detected. The transmission area TA may at least overlap the active area AA. For example, the transmission area TA overlaps the front surface or at least a portion of the active area AA. Accordingly, the user may view the image IM through the transmission area TA or provide an external input. However, this is illustratively shown, and the area where the image IM is displayed in the active area AA and the area where the external input is detected may be separated from each other, and is not limited to any one specific configuration.

The peripheral area NAA may be an area covered by the bezel area BZA. The peripheral area NAA is adjacent to the active area AA. The peripheral area NAA may surround the active area AA. A driving circuit, a driving wiring, and the like for driving the active area AA may be disposed in the peripheral area NAA.

The driving module DC is electrically connected to the display module DM. The driving module DC includes a main circuit board MB and a first flexible circuit film D_FCB.

The main circuit board MB may include various driving circuits for driving the display module DM, connectors for power supply, and the like. The first flexible circuit film D_FCB may be connected to the main circuit board MB and the display module DM. The driving module DC may further include a driving chip DIC mounted on the first flexible circuit film D_FCB. In one embodiment, the driving chip DIC may be directly mounted on the display module DM.

The housing HU is coupled with the window WP. The housing HU is coupled with the window WP to provide a predetermined inner space. The display module DM may be accommodated in the inner space. The housing HU may include a material having a relatively high stiffness. For example, the housing HU may include a plurality of frames and/or plates including glass, plastic, or metal, or a combination thereof. The housing HU may stably protect the components of the display device DD accommodated in the inner space from external impacts.

A battery module or the like that supplies power required for the overall operation of the display device DD may be disposed between the display module DM and the housing HU.

Referring to FIGS. 1B and 2, the display module DM may include a display panel DU and an input detection unit TU.

The display panel DU may display the image IM (refer to FIG. 1A) according to an electrical signal, and the input detection unit TU may detect the user input applied from the outside. The user input may include various types of inputs provided outside the display device DD. The display panel DU may be a light emitting display panel, and is not particularly limited. For example, the display panel DU may be an organic light emitting display panel or a quantum dot light emitting display panel. The externally applied the user input may be provided in various forms. For example, the user input may include an external input (e.g., hovering) that is applied close to or spaced a predetermined distance from the display device DD as well as contact by a portion of the body, such as the user's hand. In addition, the user input may have various forms such as force, pressure, temperature, and light.

The front surface IS of the display module DM may be defined as the active area AA and the peripheral area NAA. The active area AA may be defined as an area for emitting the image IM provided by the display module DM. According to the illustrated embodiment, the biometric information detection area BSA may be included in the active area AA. For example, the biometric information detection area BSA may be surrounded by the active area AA. The biometric information detection area BSA may be defined as an area for detecting biometric authentication information of a user. As an embodiment, in the biometric information detection area BSA, a user's fingerprint may be detected as the biometric authentication information.

Referring to FIG. 2, the display panel DU includes a base layer BL, a display circuit layer CL, a display element layer ED, and an encapsulation layer TFE. The display panel DU may be a flexible display panel. However, the embodiments are not limited thereto. For example, the display panel DU may be a foldable display panel that is folded based on a folding axis or a rigid display panel.

The base layer BL may include a synthetic resin film. A synthetic resin layer is formed on a work substrate used in manufacturing the display panel DU. Then, a conductive layer and an insulating layer are formed on the synthetic resin layer. When the working substrate is removed, the synthetic resin film is completed as the base layer BL. The synthetic resin layer may be a polyimide-based resin layer, and the material thereof is not particularly limited. In addition, the base layer BL may include a glass substrate, a metal substrate, or an organic/inorganic composite substrate.

The display circuit layer CL is disposed on the base layer BL. The display circuit layer CL includes at least one insulating layer and circuit elements. Hereinafter, the insulating layer included in the display circuit layer CL is referred to as an intermediate insulating layer. The intermediate insulating layer includes at least one intermediate inorganic film and at least one intermediate organic film. Circuit elements include signal lines, driving circuits for pixels, and the like. The display circuit layer CL may be formed through a formation process of an insulating layer, a semiconductor layer, and a conductive layer by a coating, a deposition, and the like, and a patterning process of an insulating layer, a semiconductor layer, and a conductive layer by a photolithography process.

The display element layer ED may include a light emitting element and a pixel defining film. The display element layer ED will be described in detail later with reference to FIG. 4.

The encapsulation layer TFE seals the display element layer ED. The encapsulation layer TFE may include at least one organic film and at least one inorganic film. The inorganic film may protect the display element layer ED from moisture/oxygen. The inorganic film may include a silicon nitride layer, a silicon oxynitride layer, and a silicon oxide layer, a titanium oxide layer, or an aluminum oxide layer and is not limited thereto.

Referring to FIG. 3, the display panel DU may include a driving circuit GDC, a plurality of signal lines SGL, and a plurality of pixels PX. The display panel DU may further include a pixel pad part PLD disposed in the peripheral area NAA. The pixel pad part PLD includes pixel pads D_PD connected to a corresponding signal line among the plurality of signal lines SGL.

The pixels PX are disposed in the active area AA. Each of the pixels PX includes an organic light emitting element and a pixel driving circuit connected to organic light emitting element. The driving circuit GDC, the signal lines SGL, the pixel pad part PLD, and the pixel driving circuit may be included in the display circuit layer CL illustrated in FIG. 2.

The driving circuit GDC may include a gate driving circuit. The gate driving circuit generates a plurality of gate signals (hereinafter, gate signals), and sequentially outputs the gate signals to a plurality of gate lines (hereinafter, gate lines) described later. The gate driving circuit may further output another control signal to the pixel driving circuit.

The signal lines SGL include the gate lines GL, data lines DL, a pixel power supply line PPL, and a control signal line CSL. One gate line of the gate lines GL is connected to a corresponding pixel PX among the pixels PX, and one data line of the data lines DL is connected to a corresponding pixel PX among the pixels PX. The pixel power supply line PPL is connected to the pixels PX. The control signal line CSL may provide control signals to the gate driving circuit. The signal lines SGL overlap the active area AA and the peripheral area NAA.

The pixel pad part PLD is a part to which the first flexible circuit film D_FCB is connected, and the pixel pads D_PD of the pixel pad part PLD are connected to pads corresponding to the first flexible circuit film D_FCB. The pixel pads D-PD may be provided by exposing some of the wirings disposed on the display circuit layer CL from the insulating layer included in the display circuit layer CL.

The pixel pads D_PD are electrically connected to corresponding pixels PX through signal lines SGL. Also, a driving circuit GDC may be connected to any one of the pixel pads D_PD.

Each of the pixels PX receives a gate signal from the corresponding gate line GL, and receives a data signal from the corresponding data line DL. Also, each pixel PX receives the first power voltage from the pixel power supply line PPL. Each pixel PX may include one or more thin film transistors, capacitors, and organic light emitting elements.

Referring to FIG. 2 again, the input detection unit TU may be directly disposed on the display panel DU. According to one embodiment, the input detection unit TU may be disposed directly on the encapsulation layer TFE. In this specification, "directly disposed" means "being formed" through a continuous process, excluding "attached" through an additional adhesive layer. The input detection unit TU may be coupled to the encapsulation layer TFE through an adhesive film disposed on the encapsulation layer TFE, and is not limited to any one embodiment.

The input detection unit TU includes detection electrodes, each of which includes detection patterns and detection lines. The detection patterns and detection lines may have a single layer or multi-layer structure.

Referring to FIGS. 1B and 2, the display device DD may further include a detection module LSM disposed on the rear surface of the display module DM. The detection module LSM may be disposed on the rear surface of the display module DM in correspondence with the biometric information detection area BSA. The detection module LSM may detect external information such as biometric authentication information inputted through the biometric information detection area BSA. The detection module LSM may detect the biometric authentication information by receiving an external signal including biometric authentication information. The biometric information detection area BSA is illustrated as being a partial area included in the active area AA of the display module DM, but those skilled in the art of the present invention will readily understand that the biometric information detection area BSA may be applied to the entire active area AA. When the biometric information detection area BSA is expanded to the entire area of the active area AA, the detection module LSM may be arranged corresponding to the active area AA of the display module DM.

As an embodiment, the detection module LSM may be a light detection module that detects light including biometric authentication information. However, the embodiments are not limited thereto. For example, the detection module LSM may be an ultrasonic detection module that detects ultrasonic waves including biometric authentication information. Hereinafter, a case where the detection module LSM is a light detection module will be described as an example.

The detection module LSM may include a sensor unit SU and an optical system OS. The sensor unit SU may include a recognition sensor capable of recognizing the biometric authentication information of the user. As an embodiment, the recognition sensor may be a fingerprint recognition sensor that recognizes the user's fingerprint.

The optical system OS may be disposed on the sensor unit SU. The optical system OS receives light including the biometric authentication information from the outside and provides the received biometric authentication information to the sensor unit SU. Hereinafter, in order to distinguish light including the biometric authentication information from external light that does not include the biometric authentication information, the light including the biometric authentication information is referred to as an information light. As an embodiment, the structure in which the optical system OS is disposed between the sensor unit SU and the display panel DU is illustrated, but the position of the optical system OS is not limited thereto. For example, the optical system OS may be disposed in the display panel DU.

The detection module LSM may further include a second flexible circuit film B_FCB and a read-out chip ROIC. The read-out chip ROIC outputs a sensor driving signal for driving the sensor unit SU to the sensor unit SU, and receives a detection signal from the sensor unit SU. The read-out chip ROIC is mounted on the second flexible circuit film B_FCB, and is electrically connected to the sensor unit SU through the second flexible circuit film B_FCB.

The detection module LSM further includes an adhesive layer AL provided on an uppermost layer of the detection module LSM. The detection module LSM may be fixed to the rear surface of the display panel DU by the adhesive layer AL. As an embodiment, the adhesive layer AL may include an optically transparent adhesive material. Although the structure in which the adhesive layer AL is disposed on the optical system OS is illustrated in FIG. 2, the position of the adhesive layer AL is not limited thereto. For example, when the optical system OS is disposed in the display panel DU, the adhesive layer AL may be disposed on the sensor unit SU.

Figure 4:
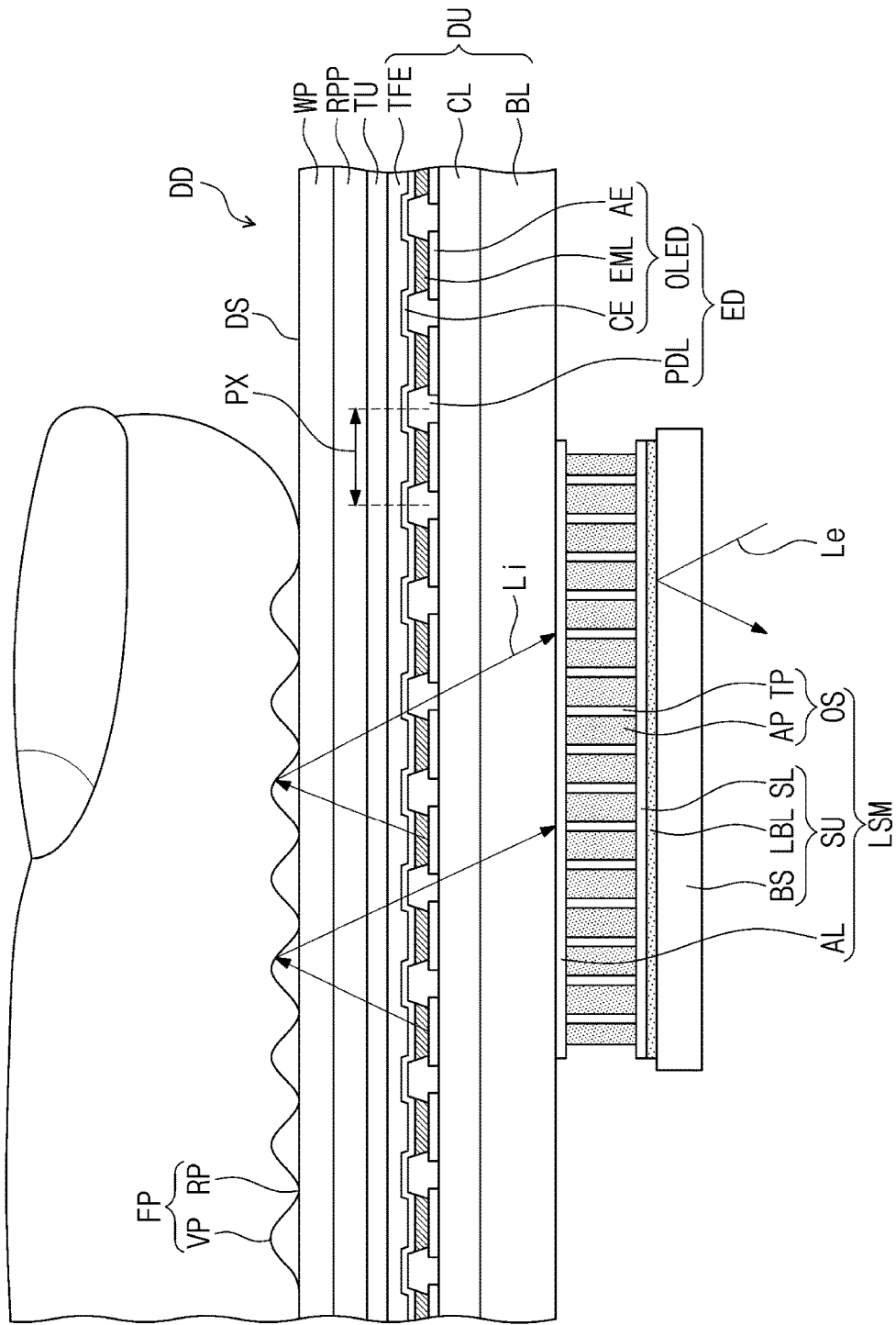
FIG. 4 is a partially enlarged cross-sectional view of the display device of FIG. 1A.

FIG. 4 is a partially enlarged cross-sectional view of the display device of FIG. 1A. The same reference numerals in FIG. 4 are used for components identical or similar to the components shown in FIG. 2 and a detailed description thereof is omitted to avoid redundancy.

Referring to FIG. 4, the display panel DU includes the base layer BL, the display circuit layer CL disposed on the base layer BL, the display element layer ED, and the encapsulation layer TFE. The display panel DU may further include functional layers such as an antireflection layer, a refractive index control layer, and so on.

The display element layer ED may include a pixel defining film PDL and a light emitting element OLED. The pixel defining film PDL may include an organic material. The light emitting element OLED may include a first electrode AE, a light emitting layer EML, and a second electrode CE. The first electrode AE is disposed on the display circuit layer CL. The pixel defining film PDL is formed on the first electrode AE. An opening part is defined in the pixel defining film PDL. The opening part of the pixel defining film PDL exposes at least a portion of the first electrode AE. In one embodiment, the pixel defining film PDL may be omitted.

The light emitting layer EML may be disposed in an area corresponding to the opening part. That is, the light emitting layer EML may be formed separately from each of the pixels PX. The light emitting layer EML may include an organic light emitting material and/or an inorganic light emitting material. The light emitting layer EML may generate a predetermined colored light. For example, the light emitting layer EML may generate at least one of red light, green light, and blue light. The light emitting layer EML may include a quantum dot or a quantum rod.

In this embodiment, the light emitting layer EML patterned in units of pixels PX is exemplarily illustrated, but the embodiments are not limited thereto. The second electrode CE is disposed on the light emitting layer EML. The second electrode CE may be commonly disposed in the pixels PX. The encapsulation layer TFE is disposed on the second electrode CE. In FIG. 4, the light emitting element OLED has an organic light emitting diode structure as an example, but the embodiments are not limited thereto. That is, the light emitting element OLED may have the structure of an inorganic light emitting diode, a quantum dot light emitting diode, and a micro light emitting diode, for example.

The detection module LSM is disposed under the display panel DU and receives light outputted from the display panel DU to recognize the biometric authentication information.

When the display panel DU is operated, light including image information is outputted from the light emitting layer EML of the display panel DU, and the outputted light is displayed as an image on the display surface DS. When a user touches a finger on the display surface DS, the above-described light is reflected by the finger and is provided to the detection module LSM located under the display panel DU.

When the user's fingerprint FP touches the display surface DS, the difference between the amount of a reflection light reflected from the ridge of the user's fingerprint FP and the amount of a reflection light reflected from the valley VP appears. The detection module LSM may recognize the user's fingerprint FP using above-described difference.

The detection module LSM includes the sensor unit SU and the optical system OS.

The optical system OS includes a transmission part TP for transmitting the information light Li incident to the detection module LSM and a light absorbing part AP provided around the transmission part TP to absorb the information light Li. The optical system OS may include a collimator layer for condensing the information light Li reflected by a finger. The collimator layer may have a structure in which a plurality of opening parts or a plurality of slits are formed, and as an example embodiment, the opening parts or the slits may pass only light having an incident angle within a predetermined angular range among incident light. The angular range described above may vary according to the width of each of the opening parts or the slits. Here, the opening parts or the slits may be defined as the transmission part TP of the optical system OS.

The light absorbing part AP may have a property of absorbing light. The light absorbing part AP may be a colored layer. For example, the light absorbing part AP may include a material in which particles absorbing light are dispersed. In addition, the light absorbing part AP may be a layer in which carbon-based pigments are mixed.

The sensor unit SU is disposed under the optical system OS and receives the information light Li that has passed through the transmission part TP. That is, the optical system OS may prevent light (i.e., external light Le) other than the information light Li reflected by the finger from entering the sensor unit SU.

The sensor unit SU includes a substrate in the form of a base board BS, a member to block light, which may be in the form of a light shielding layer LBL disposed on the base board BS, and a sensing layer SL disposed on the light shielding layer LBL.

The base board BS may be an insulating substrate. For example, the base board BS may be a silicon substrate, a glass substrate, or a plastic substrate.

The light shielding layer LBL may be disposed on the upper surface of the base board BS. The light shielding layer LBL may block the external light Le incident from the rear surface of the base board BS from being provided to the sensing layer SL. As an embodiment, the light shielding layer LBL may include a metal material having high reflectance. That is, the light shielding layer LBL reflects the external light Le incident through the base board BS to block the external light Le from being provided to the sensing layer SL. The light shielding layer LBL may be provided in a size corresponding to the sensing layer SL. However, the embodiments are not limited thereto. For example, the light shielding layer LBL may be provided to partially correspond to the sensing layer SL.

The sensing layer SL may be disposed on the light shielding layer LBL. The optical system OS may be disposed on the sensing layer SL. The sensing layer SL senses the information light Li that has passed through the transmission part TP of the optical system OS.

Figure 5A:
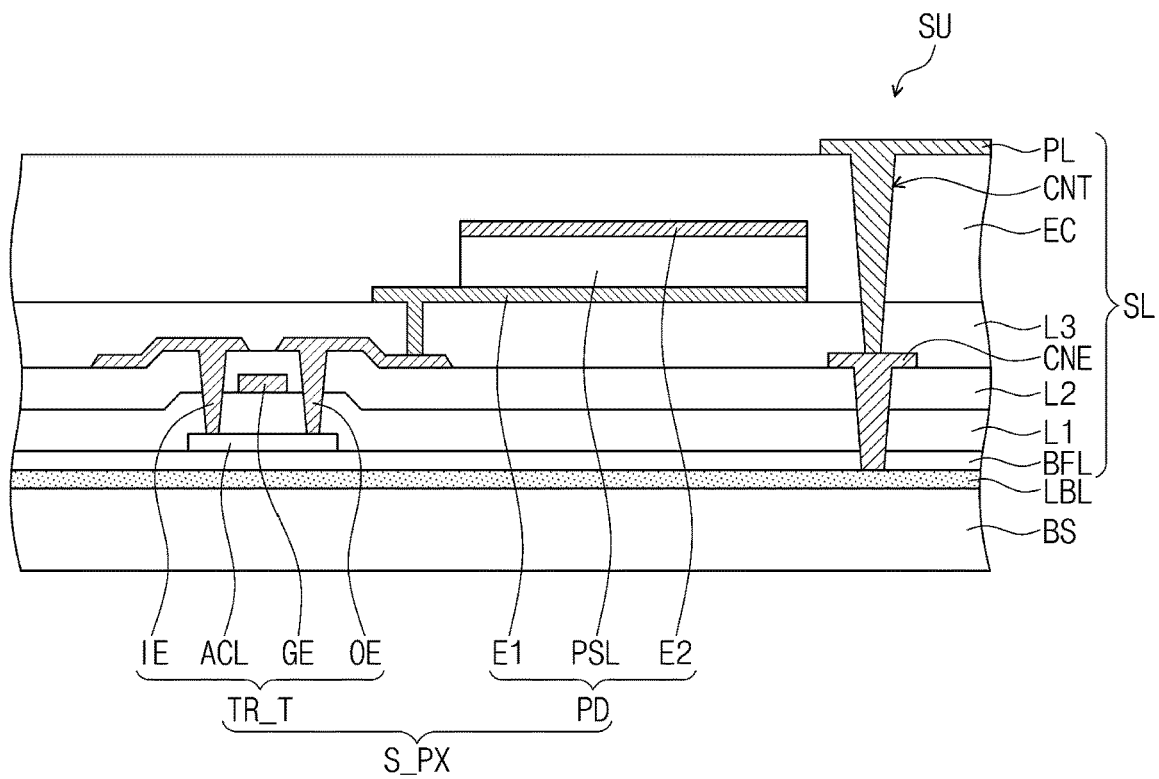
FIG. 5A is an enlarged cross-sectional view of an embodiment of a sensor unit constructed according to the principles of the invention.
Figure 5B:
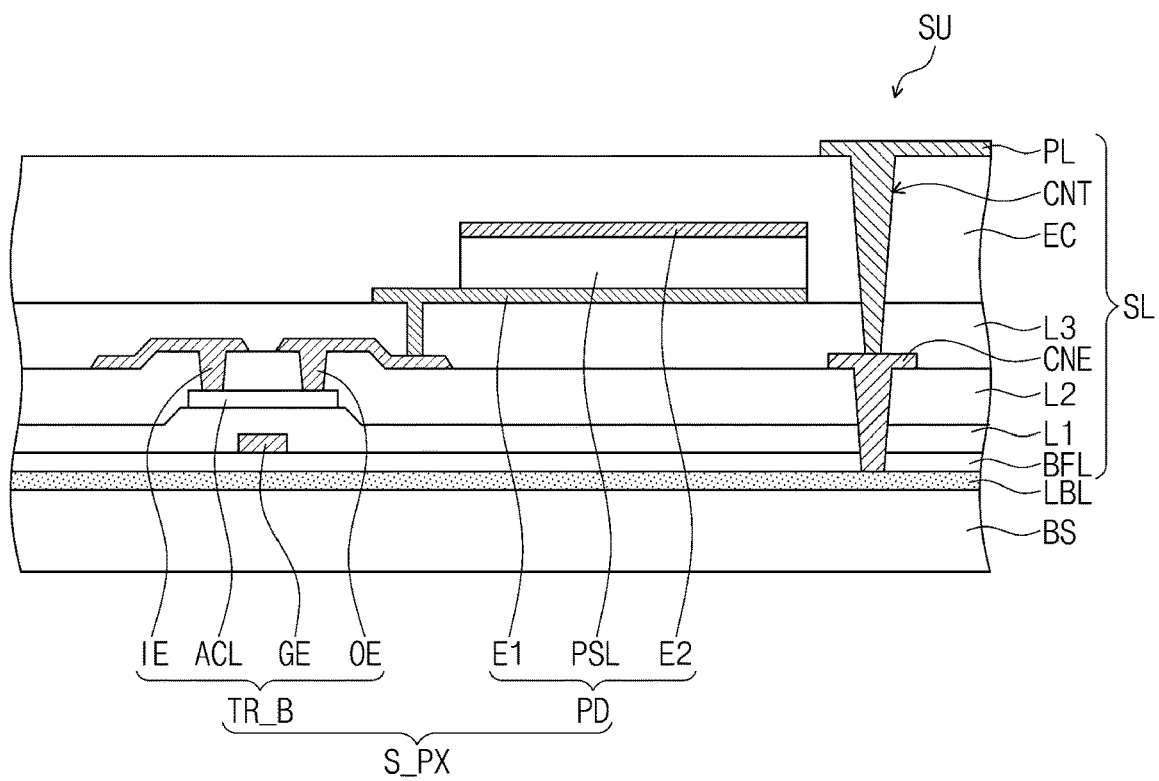
FIG. 5B is an enlarged cross-sectional view of an embodiment of a sensor unit constructed according to the principles of the invention.
Figure 6:
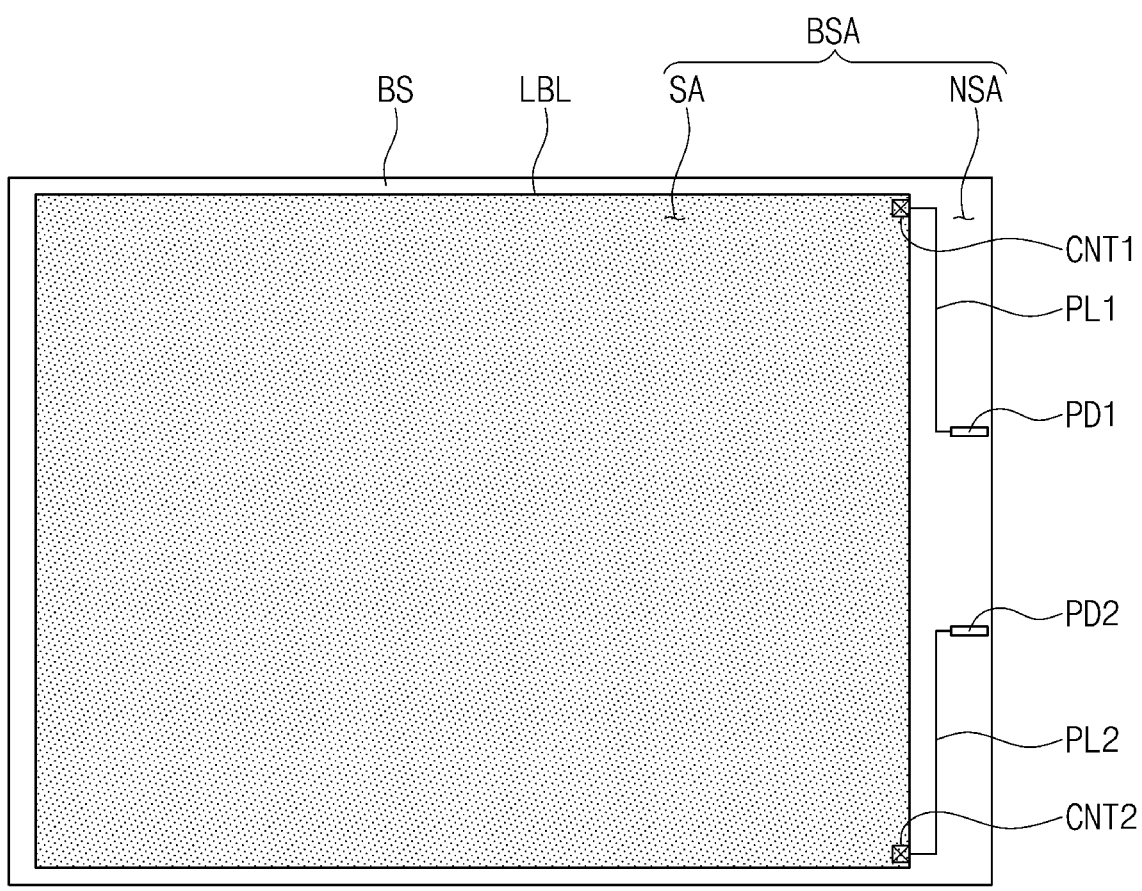
FIG. 6 is a plan view showing the light shielding layer and the power supply line shown in FIGS. 5A and 5B.

FIGS. 5A and 5B are enlarged cross-sectional views of embodiments of a sensor unit constructed according to the principles of the invention. FIG. 6 is a plan view showing the light shielding layer and the power supply line shown in FIGS. 5A and 5B.

Referring to FIGS. 4 and 5A, the sensor unit SU includes the base board BS, the light shielding layer LBL, and the sensing layer SL. The light shielding layer LBL is disposed on the base board BS, and the sensing layer SL is disposed on the light shielding layer LBL. That is, the light shielding layer LBL is disposed between the base board BS and the sensing layer SL.

The sensing layer SL may include a plurality of sensing pixels S_PX. The plurality of sensing pixels S_PX may be arranged in an array form. Each sensing pixel S_PX includes a detector that may be in the form of a detection element PD and a sensor driving circuit for driving the detection element PD.

The sensor driving circuit may electrically connect the detection element PD and an external electronic element (e.g., the read-out chip ROIC (shown in FIG. 2)). The sensor driving circuit may supply an external power to the detection element PD, control the operation of the detection element PD, or provide an electrical signal generated by the detection element PD to the external electronic element.

The sensing layer SL may further include a plurality of signal wirings connected to the sensing pixels S_PX. The sensing layer SL may further include a buffer layer BFL and a plurality of insulating layers L1 to L3. The buffer layer BFL is disposed on the light shielding layer LBL, and may include an insulating material. For example, the buffer layer BFL may include either an organic film or an inorganic film. The insulating layers L1 to L3 include a first insulating layer L1, a second insulating layer L2, and a third insulating layer L3 that are sequentially stacked.

The sensor driving circuit may include at least one transistor TR_T. The transistor TR_T is connected to the detection element PD to provide an electrical signal to the detection element PD. The transistor TR_T controls the operation of the detection element PD. The transistor TR_T includes an active layer ACL, a control electrode GE, an input electrode IE, and an output electrode OE.

The active layer ACL is disposed on the buffer layer BFL and is covered by the first insulating layer L1. The control electrode GE overlaps the active layer ACL and the first insulating layer L1 is disposed between the active layer ACL and the control electrode GE. The second insulating layer L2 is disposed on the control electrode GE. The control electrode GE and the first insulating layer L1 are covered by the second insulating layer L2. The input electrode IE and the output electrode OE are disposed on the second insulating layer L2.

The input electrode IE and the output electrode OE are spaced apart from each other on a plane. In addition, the input electrode IE and the output electrode OE overlap the active layer ACL. The input electrode IE and the output electrode OE may be in contact with the active layer ACL through a through hole provided in the first and second insulating layers L1 and L2. The transistor TR_T controls charge transfer in the active layer ACL through the control electrode GE, and outputs an electrical signal inputted from the input electrode IE through the output electrode OE.

The third insulating layer L3 is disposed on the transistor TR_T, and the detection element PD is disposed on the third insulating layer L3. The detection element PD is electrically connected to the transistor TR_T. The detection element PD may be connected to the output electrode OE of the transistor TR_T. When the sensor driving circuit includes a plurality of transistors, the detection element PD may be connected to one of the plurality of transistors. The detection element PD may include a photodiode. In this case, the detection element PD includes a light detection layer PSL, a first light detection electrode E1, and a second light detection electrode E2. The first and second light detection electrodes E1 and E2 are disposed spaced apart from each other and the light detection layer PSL is interposed between the first and second light detection electrodes E1 and E2.

The first light detection electrode E1 is disposed on the third insulating layer L3 and may be connected to the output electrode OE of the transistor TR_T through a through hole provided in the third insulating layer L3. Accordingly, the first light detection electrode E1 may receive an electrical signal from the transistor TR_T. The second light detection electrode E2 may have conductivity and transparency. For example, the second light detection electrode E2 may include a transparent conductive oxide. The information light Li provided to the sensing layer SL may pass through the second light detection electrode E2 and be provided to the light detection layer PSL. The light detection layer PSL overlaps the transmission part TP (refer to FIG. 4) of the optical system OS (refer to FIG. 4), and the transistor TR_T may overlap the light absorbing part AP (refer to FIG. 4) of the optical system OS (refer to FIG. 4). Accordingly, the information light Li passes through the transmission part TP and is provided to the detection element PD, but the information light Li absorbed by the light absorbing part AP cannot be incident on the transistor TR_T.

The first and second light detection electrodes E1 and E2 may receive electrical signals different from each other. The second light detection electrode E2 is connected to a common voltage line to receive a common voltage. The second light detection electrode E2 may be commonly disposed in the sensing pixels S_PX. That is, the second light detection electrodes of the sensing pixels S_PX may be formed as one electrode. Since the first light detection electrode E1 and the second light detection electrode E2 are spaced apart from each other with the light detection layer PSL which is interposed between the first light detection electrode E1 and the second light detection electrode E2, a predetermined electric field may be formed between the first light detection electrode E1 and the second light detection electrode E2. The light detection layer PSL generates an electrical signal by the information light Li incident on the light detection layer PSL. The light detection layer PSL may absorb the energy of incident light to generate charge. For example, the light detection layer PSL may include a light sensitive semiconductor material.

The charge generated in the light detection layer PSL changes the electric field between the first light detection electrode E1 and the second light detection electrode E2. The amount of charge generated in the light detection layer PSL varies depending on whether light is incident on the detection element PD, and the amount and intensity of light incident on the detection element PD. Accordingly, the electric field formed between the first light detection electrode E1 and the second light detection electrode E2 may be changed. The detection element PD may obtain fingerprint information of the user through the change in the electric field between the first light detection electrode E1 and the second light detection electrode E2.

However, this is exemplarily illustrated, and the detection element PD may include a photo transistor having the light detection layer PSL as an active layer. At this time, the detection element PD may detect the amount of current flowing through the photo transistor to obtain the fingerprint information. The detection element PD according to an embodiment may include various photoelectric conversion elements capable of generating an electrical signal in response to a change in the amount of light, and is not limited to any one embodiment.

Furthermore, in addition to light detection elements that may generate electrical signals in response to changes in light intensity, various types of detection elements may be employed in the detection element PD according to a detection target and a detection method of the detection module LSM (shown in FIG. 4). For example, an ultrasonic detection element that detects ultrasound and generates an electrical signal or a piezoelectric element that detects pressure and outputs an electrical signal may be used as the detection element PD.

The sensing layer SL further includes a protection layer EC. The protection layer EC is disposed on the detection element PD to cover the detection element PD. The protection layer EC may have insulating properties. For example, the protection layer EC may include at least one organic film and/or inorganic film. The protection layer EC protects the detection element PD by preventing external moisture, contamination, or impact from affecting the detection element PD. This feature is illustratively described, and in the detection module LSM, the protection layer EC may be omitted.

The sensing layer SL may further include a power supply line PL for supplying a light blocking voltage $V_{BL}$ (shown in FIG. 7A) to the light shielding layer LBL and a connection electrode CNE electrically connected to the light shielding layer LBL. The connection electrode CNE may be disposed on the same layer as the input and output electrodes IE and OE of the transistor TR_T. That is, the connection electrode CNE is disposed on the second insulating layer L2, and may be connected to the light shielding layer LBL through the through holes provided in the buffer layer BFL, the first insulating layer L1, and the second insulating layer L2. However, the position of the connection electrode CNE is not limited thereto. The connection electrode CNE may be disposed on the same layer as the control electrode GE.

The power supply line PL is disposed on the protection layer EC and is electrically connected to the connection electrode CNE. The power supply line PL may be connected to the connection electrode CNE through a contact part CNT provided to pass through the protection layer EC and the third insulating layer L3. However, the position of the power supply line PL is not limited to this. For example, the power supply line PL may be disposed on the same layer as the first light detection electrode E1. In this case, the power supply line PL is connected to the connection electrode CNE through a through hole provided in the third insulating layer L3 and may be covered by the protection layer EC.

Except for the control electrode GE overlapping the active layer ACL and being disposed under the active layer ACL, the sensing layer SL illustrated in FIG. 5B may have the same structure as the sensing layer SL illustrated in FIG. 5A. That is, the transistor TR_T shown in FIG. 5A has a top gate structure, and the transistor TR_B shown in FIG. 5B has a bottom gate structure. The control electrode GE of the transistor TR_B having the bottom gate structure is disposed on the buffer layer BFL, and the active layer ACL is disposed on the first insulating layer L1. The input electrode IE and the output electrode OE may be connected to the active layer ACL through the through holes penetrating the second insulating layer L2.

In FIGS. 5A and 5B, the transistors TR_T and TR_B may be disposed corresponding to the light absorbing part AP (refer to FIG. 4) of the optical system OS (refer to FIG. 4), and the detection element PD may be overlap the transmission part TP (refer to FIG. 4) of the optical system OS (refer to FIG. 4). Therefore, some of the information light Li provided from the outside passes through the transmission part TP and is provided to the detection element PD but some of the information light Li is blocked by the light absorbing part AP so as not to be provided to the transistors TR_T and TR_B.

Referring to FIG. 6, the base board BS overlaps the biometric information detection area BSA. The biometric information detection area BSA includes a detection area SA that substantially detects the biometric authentication information and a non-detection area NSA provided around the detection area SA. The light shielding layer LBL may be provided on the base board BS corresponding to the detection area SA.

The power supply line PL is electrically connected to the light shielding layer LBL as shown in FIGS. 5A and 5B. As an embodiment, the power supply line PL may include first and second power supply lines PL1 and PL2 disposed in the non-detection area NSA. However, the number of power supply lines PL is not limited to this. The power supply line PL may include one power supply line or three or more power supply lines.

One end of the first power supply line PL1 overlaps the light shielding layer LBL as shown in FIGS. 5A and 5B in the detection area SA, and one end of the second power supply line PL2 overlaps the light shielding layer LBL in the detection area SA. A first contact portion CNT1 is provided at a portion where the first power supply line PL1 and the light shielding layer LBL overlap, and a second contact portion CNT2 is provided at a portion where the second power supply line PL2 and the light shielding layer LBL overlap. Therefore, the first power supply line PL1 is connected to the light shielding layer LBL through the first contact portion CNT1, and the second power supply line PL2 is connected to the light shielding layer LBL through the second contact portion CNT2. The connection structure of the first and second power supply lines PL1 and PL2 and the light shielding layer LBL is similar to the connection structure of the power supply line PL and the light shielding layer LBL shown in FIGS. 5A and 5B. Therefore, detailed description of the connection structure is omitted to avoid redundancy.

A first power supply pad PD1 is connected to the other end of the first power supply line PL1, and a second power supply pad PD2 is connected to the other end of the second power supply line PL2. The first and second power pads PD1 and PD2 may be connected to the read-out chip ROIC (shown in FIG. 2) through the second flexible circuit film B_FCB (shown in FIG. 2). Accordingly, the first and second power pads PD1 and PD2 may receive a light blocking voltage $V_{BL}$ (shown in FIG. 7A) from the read-out chip ROIC. The first and second power supply lines PL1 and PL2 may supply the light blocking voltage $V_{BL}$ received through the first and second power pads PD1 and PD2 to the light shielding layer LBL.

When the size of the detection module LSM (shown in FIG. 2) is increased, in order to uniformly apply the light blocking voltage $V_{BL}$ to the entire area of the light shielding layer LBL, the number of power supply lines PL connected to the light shielding layer LBL may be increased. Or, as increasing the number of contact portions to which the power supply line PL and light shielding layer LBL are connected, the light blocking voltage $V_{BL}$ may be uniformly applied to the entire area of the light shielding layer LBL.

Figure 7A:
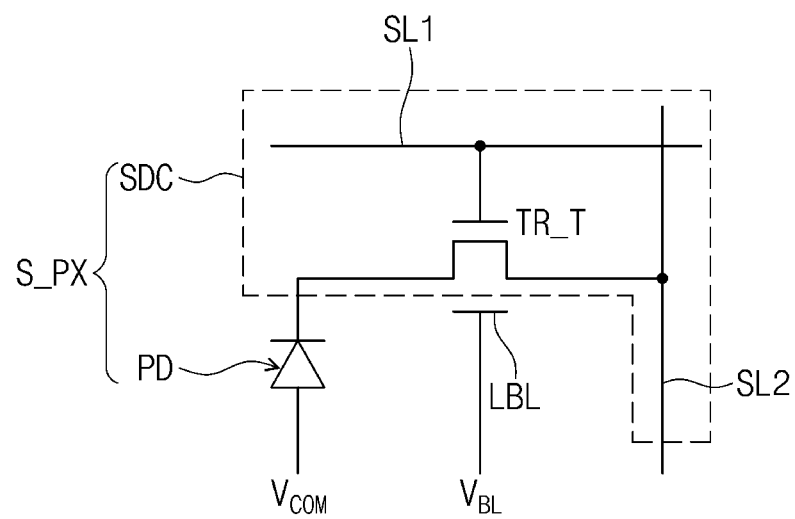
FIG. 7A is an equivalent circuit diagram of the representative sensing pixel of FIGS. 5A and 5B.
Figure 7B:
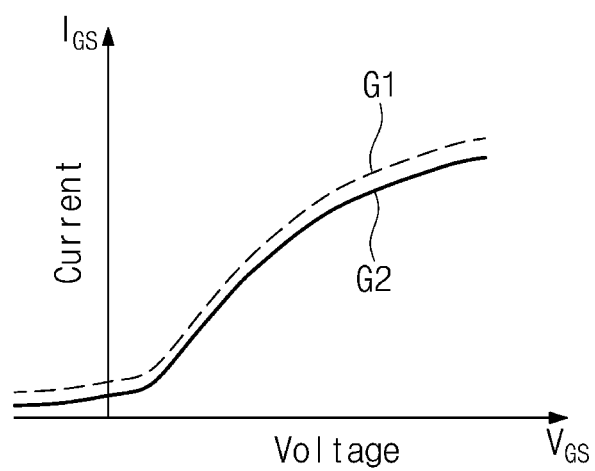
FIG. 7B is a graph showing off-current characteristics of the transistor shown in FIG. 7A.

FIG. 7A is an equivalent circuit diagram of the representative sensing pixel of FIGS. 5A and 5B and FIG. 7B is a graph showing off-current characteristics of the transistor shown in FIG. 7A.

Referring to FIGS. 5A and 7A, the sensing pixel S_PX may include a sensor driving circuit SDC and a detection element PD. The sensor driving circuit SDC may include at least one transistor TR_T and first and second sensing lines SL1 and SL2 connected to the transistor TR_T. Although the structure in which the sensor driving circuit SDC includes one transistor TR_T is illustrated as an example in FIG. 7A, the number of transistors included in the sensor driving circuit SDC is not limited thereto.

The first sensing line SL1 may be connected to the control electrode GE of the transistor TR_T, and the second sensing line SL2 may be connected to the input electrode IE of the transistor TR_T. When the first sensing line SL1 receives the sensing signal, the transistor TR_T is turned on, and the output of the detection element PD is provided to the second sensing line SL2 through the turned-on transistor TR_T. The second sensing line SL2 may provide the output of the detection element PD to the read-out chip ROIC (refer to FIG. 2). The first light detection electrode E1 of the detection element PD may be connected to the output electrode OE of the transistor TR_T, and a reference voltage $V_{COM}$ may be provided to the second light detection electrode E2.

The light shielding layer LBL overlaps at least the transistor TR_T. However, the light shielding layer LBL may be disposed throughout the detection area SA (shown in FIG. 6) to overlap the transistor TR_T, the detection element PD and the first and second sensing lines SL1 and SL2. A light blocking voltage $V_{BL}$ is applied to the light shielding layer LBL. The light blocking voltage $V_{BL}$ may be a voltage of about 5V to about 10V. However, the voltage level of the light blocking voltage $V_{BL}$ is not particularly limited. That is, the voltage level of the light blocking voltage $V_{BL}$ may be set differently according to the characteristics of the transistor TR_T. For example, the light blocking voltage $V_{BL}$ may be a negative voltage, a positive voltage, or a ground voltage.

FIG. 7B is a graph showing off-current characteristics of the transistor shown in FIG. 7A. In FIG. 7B, the first graph G1 shows the voltage-current characteristic of the transistor TR_T in a state in which the light shielding layer LBL is not provided, and the second graph G2 shows the voltage-current characteristic of the transistor TR_T in a state in which the light shielding layer LBL is provided.

When no light shielding layer LBL was provided on the sensor unit SU, the off-current of the transistor TR_T was higher than that of the transistor TR_T when the light shielding layer LBL was provided to the sensor unit SU. That is, when the light shielding layer LBL was provided, the leakage current of the transistor TR_T due to external light decreased.

By applying a constant light blocking voltage $V_{BL}$ to the light shielding layer LBL, it is possible to prevent the potential difference between the control electrode GE and the input electrode IE of the transistor TR_T from being increased to a certain level or higher due to a hysteresis phenomenon. The light blocking voltage $V_{BL}$ may be a DC voltage having a substantially constant voltage level.

When a plurality of transistors is provided in the sensor driving circuit SDC (shown in FIG. 7A), considering the characteristics of each transistor, an optimal voltage level of the light blocking voltage $V_{BL}$ may be set and applied to the light shielding layer LBL.

As such, because the light shielding layer LBL is placed, in addition to reducing the leakage current of the transistor TR_T due to external light, and it is possible to prevent the driving performance of the transistor TR_T from being lowered by applying the light blocking voltage $V_{BL}$ to the light shielding layer LBL. As a result, the sensing performance of the sensor unit SU may be improved, and the reliability of the sensor unit SU may be improved.

Figure 8A:
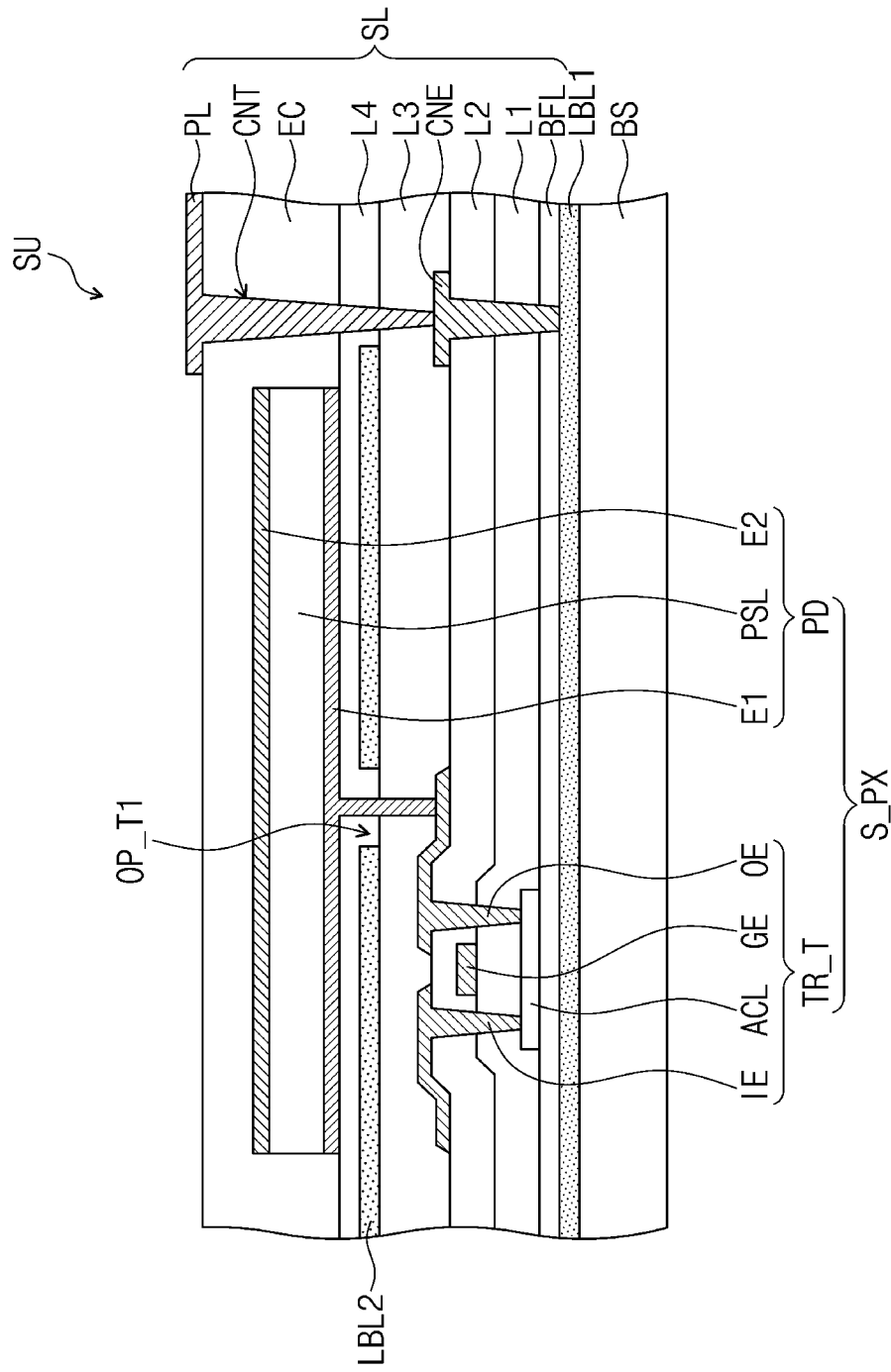
FIG. 8A is an enlarged cross-sectional view of an embodiment of a sensor unit constructed according to the principles of the invention.
Figure 8B:
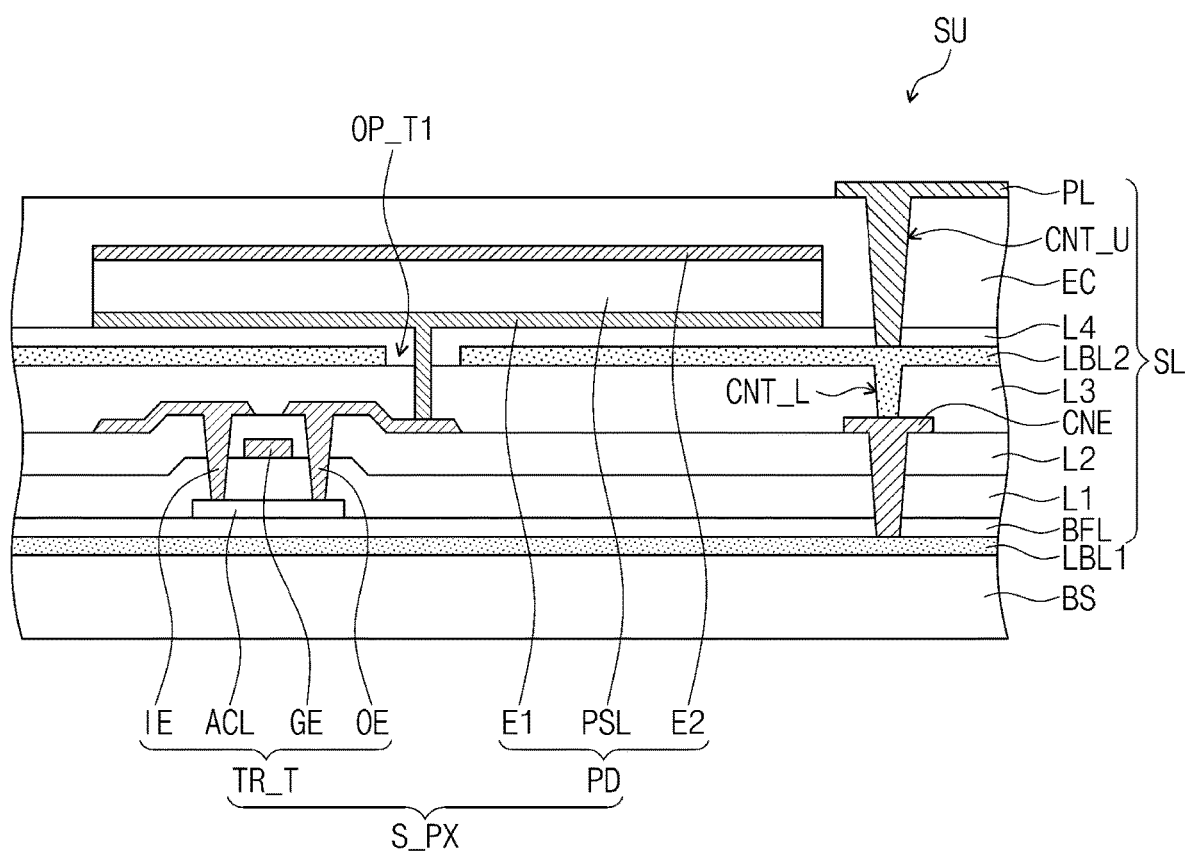
FIG. 8B is an enlarged cross-sectional view of an embodiment of a sensor unit constructed according to the principles of the invention.
Figure 9:
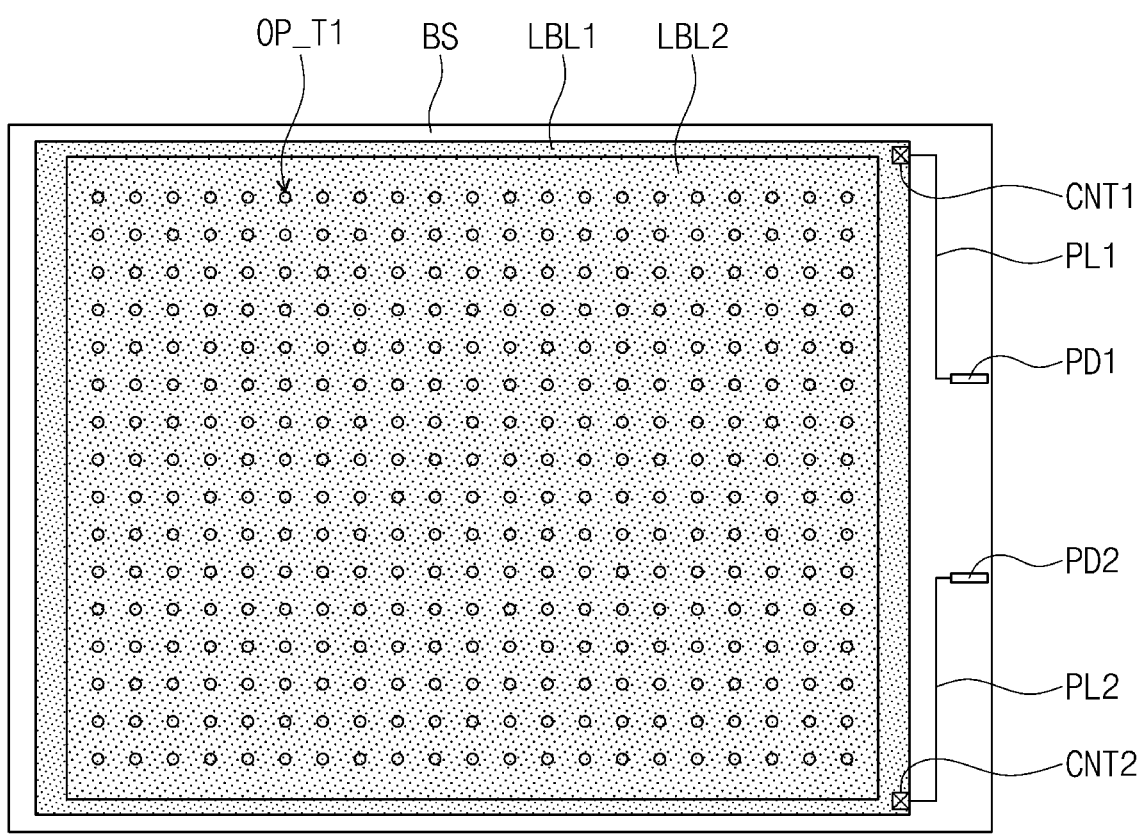
FIG. 9 is a plan view showing the upper light shielding layer, the lower light shielding layer, and the power supply line of FIG. 8A.

FIGS. 8A and 8b are enlarged cross-sectional views of embodiments of a sensor unit constructed according to the principles of the invention. FIG. 9 is a plan view showing the upper light shielding layer, the lower light shielding layer, and the power supply line in FIG. 8A. However, the same reference numerals are used in FIGS. 8A and 8B for components similar or identical to the components shown in FIG. 5A and a detailed description thereof is omitted to avoid redundancy.

Referring to FIGS. 4, 8A and 9, the sensor unit SU includes a base board BS, a lower light shielding layer LBL1, and a sensing layer SL. The lower light shielding layer LBL1 is disposed on the base board BS, and the sensing layer SL is disposed on the lower light shielding layer LBL1. That is, the lower light shielding layer LBL1 is disposed between the base board BS and the sensing layer SL.

The lower light shielding layer LBL1 may block the external light Le incident from the rear surface of the base board BS from being provided to the sensing layer SL. As an embodiment, the lower light shielding layer LBL1 may include a metal material having high reflectivity or a light absorbing material that absorbs light. That is, when the lower light shielding layer LBL1 includes a metal material, the lower light shielding layer LBL1 reflects the external light Le incident through the base board BS to block the external light Le from being provided to the sensing layer SL. On the other hand, when the lower light shielding layer LBL1 includes a light absorbing material, the lower light shielding layer LBL1 may be a colored layer. For example, the light absorbing material may be a layer in which particles that absorb light are dispersed.

The lower light shielding layer LBL1 may be provided in a size corresponding to the sensing layer SL. However, the embodiments are not limited thereto. For example, the lower light shielding layer LBL1 may be provided to partially overlap the sensing layer SL.

The sensing layer SL may include a plurality of sensing pixels S_PX and an upper light shielding layer LBL2. Each sensing pixel S_PX may have a structure similar to that of the sensing pixel S_PX shown in FIG. 5A.

The upper light shielding layer LBL2 may be disposed to cover the sensor driving circuit of each sensing pixel S_PX. As an embodiment, the upper light shielding layer LBL2 may be disposed on the third insulating layer L3. The upper light shielding layer LBL2 is disposed on the transistor TR_T included in the sensor driving circuit so that light incident through the upper surface of the sensor unit SU may be prevented from being incident upon the active layer ACL of the transistor TR_T. As an embodiment, the upper light shielding layer LBL2 may include a metal material having high reflectivity or a black organic material capable of absorbing light. That is, the upper light shielding layer LBL2 may include the same material as the lower light shielding layer LBL1 or may include different materials from the lower light shielding layer LBL1.

The detection element PD may be disposed on the upper light shielding layer LBL2. A fourth insulating layer L4 may be further disposed between the upper light shielding layer LBL2 and the detection element PD. The upper light shielding layer LBL2 and the detection element PD may be insulated by the fourth insulating layer L4. The fourth insulating layer L4 may be omitted.

The detection element PD is disposed on the fourth insulating layer L4, and the first light detection electrode E1 of the detection element PD is connected to the output electrode OE of the transistor TR_T through a through hole provided in the third insulating layer L3 and the fourth insulating layer L4. The upper light shielding layer LBL2 may be provided with a first opening part OP_T1 corresponding to the through hole. When the first opening part OP_T1 is provided in a size corresponding to the through hole, since the side surface of the upper light shielding layer LBL2 is not covered by the fourth insulating layer L4, it may be connected to the first light detection electrode E1. When the first opening part OP_T1 is provided with a size larger than the through hole, a fourth insulating layer L4 is disposed between the upper light shielding layer LBL2 and the first light detection electrode E1. Therefore, the upper light shielding layer LBL2 and the first light detection electrode E1 may be electrically insulated by the fourth insulating layer L4.

As shown in FIG. 9, the first opening part OP_T1 may have a circular shape on a plane. However, the shape of the first opening part OP_T1 is not limited thereto.

When the upper portion of the transistor TR_T is covered by the upper light shielding layer LBL2, the transistor TR_T may be disposed corresponding to the transmission part TP (shown in FIG. 4) of the optical system OS (shown in FIG. 4). That is, the transmission part TP of the optical system OS may be extended to the placement area of the transistor TR_T. As described above, when the transmission part TP is expanded, the area of the detection element PD in each sensing pixel S_PX may also be increased corresponding to the transmission part TP. In conclusion, as the transistor TR_T is covered by the upper light shielding layer LBL2, the area occupied by the detection element PD in each sensing pixel S_PX may be increased, and as a result, the overall sensing performance of the sensor unit SU may be improved.

The sensing layer SL may further include a connection electrode CNE electrically connected to the lower light shielding layer LBL1 and a power supply line PL for supplying the light blocking voltage $V_{BL}$ (shown in FIG. 7A) to the lower light shielding layer LBL1. The connection electrode CNE may be disposed on the same layer as the input and output electrodes IE and OE of the transistor TR_T. That is, the connection electrode CNE is disposed on the second insulating layer L2, and may be connected to the lower light shielding layer LBL1 through the through holes provided in the buffer layer BFL, the first insulating layer L1, and the second insulating layer L2.

The power supply line PL is disposed on the protection layer EC and is electrically connected to the connection electrode CNE. The power supply line PL may be connected to the connection electrode CNE through a contact part CNT provided to pass through the protection layer EC, the third and fourth insulating layers L3 and L4. However, the position of the power supply line PL is not limited thereto. For example, the power supply line PL may be disposed on the same layer as the first light detection electrode E1. In this case, the contact part CNT may be provided to pass through the third and fourth insulating layers L3 and L4.

The upper light shielding layer LBL2 may be opened to correspond to the contact part CNT so that the power supply line PL and the connection electrode CNE are connected to each other. As shown in FIG. 9, when the power supply line PL includes the first and second power supply lines PL1 and PL2, the lower light shielding layer LBL1 may be contacted to the first and second power supply lines PL1 and PL2 through the first and second contact parts CNT1 and CNT2, respectively. In this case, the upper light shielding layer LBL2 may be disposed so as not to overlap with the first and second contact parts CNT1 and CNT2. That is, the lower light shielding layer LBL1 may have a larger area than the upper light shielding layer LBL2, and the lower light shielding layer LBL1 may have a portion that does not overlap with the upper light shielding layer LBL2. The first and second contact parts CNT1 and CNT2 may be provided in a portion of the lower light shielding layer LBL1 which does not overlap with the upper light shielding layer LBL2.

The upper light shielding layer LBL2 illustrated in FIG. 8B may be electrically connected to the lower light shielding layer LBL1 through the connection electrode CNE. The upper light shielding layer LBL2 is connected to the connection electrode CNE through a lower contact part CNT_L provided to penetrate the third insulating layer L3. The upper light shielding layer LBL2 is connected to the power supply line PL through an upper contact part CNT_U provided to penetrate the fourth insulating layer L4 and the protection layer EC. Therefore, the light blocking voltage $V_{BL}$ (refer to FIG. 7A) supplied through the power supply line PL may be applied to the lower and upper light shielding layers LBL1 and LBL2.

FIG. 8B illustrates a structure in which the lower and upper light shielding layers LBL1 and LBL2 are connected to the power supply line PL at the same location, but the embodiments are not limited thereto. The lower and upper light shielding layers LBL1 and LBL2 may contact the power supply line PL at different locations.

In addition, although the structure in which the lower and upper light shielding layers LBL1 and LBL2 are contacted in one power supply line PL is illustrated in FIG. 8B, the embodiments are not limited thereto. That is, the lower and upper light shielding layers LBL1 and LBL2 may be connected to different power supply lines, respectively. In addition, when the lower and upper light shielding layers LBL1 and LBL2 are respectively connected to the different power supply lines, light blocking voltages having the same voltage level or light blocking voltages having different voltage levels may be applied to the lower and upper light shielding layers LBL1 and LBL2, respectively.

FIG. 8B illustrates a structure in which light blocking voltages $V_{BL}$ are applied to lower and upper light shielding layers LBL1 and LBL2, but the embodiments are not limited thereto. That is, the power supply line PL is connected to at least one of the lower and upper light shielding layers LBL1 and LBL2, so that the light blocking voltage $V_{BL}$ may be applied to at least one of the lower and upper light shielding layers LBL1 and LBL2.

Figure 10A:
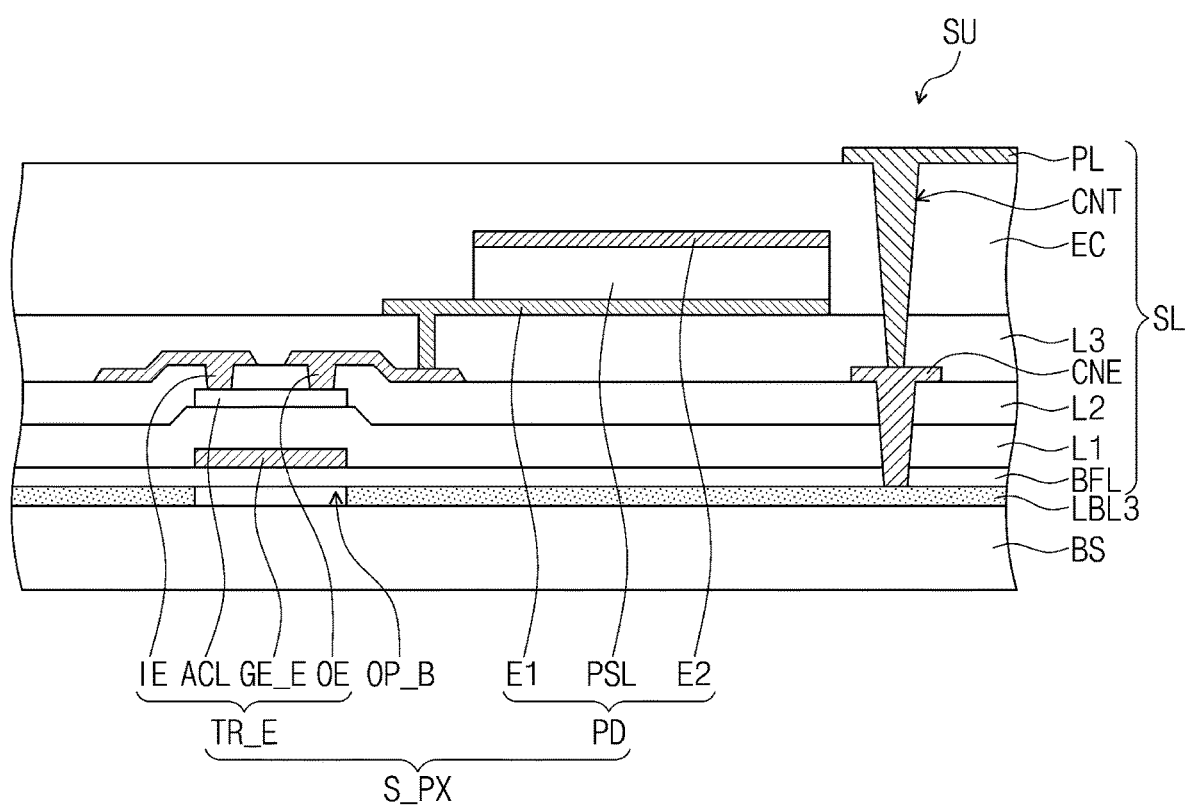
FIG. 10A is an enlarged cross-sectional view of an embodiment of a sensor unit constructed according to the principles of the invention.
Figure 10B:
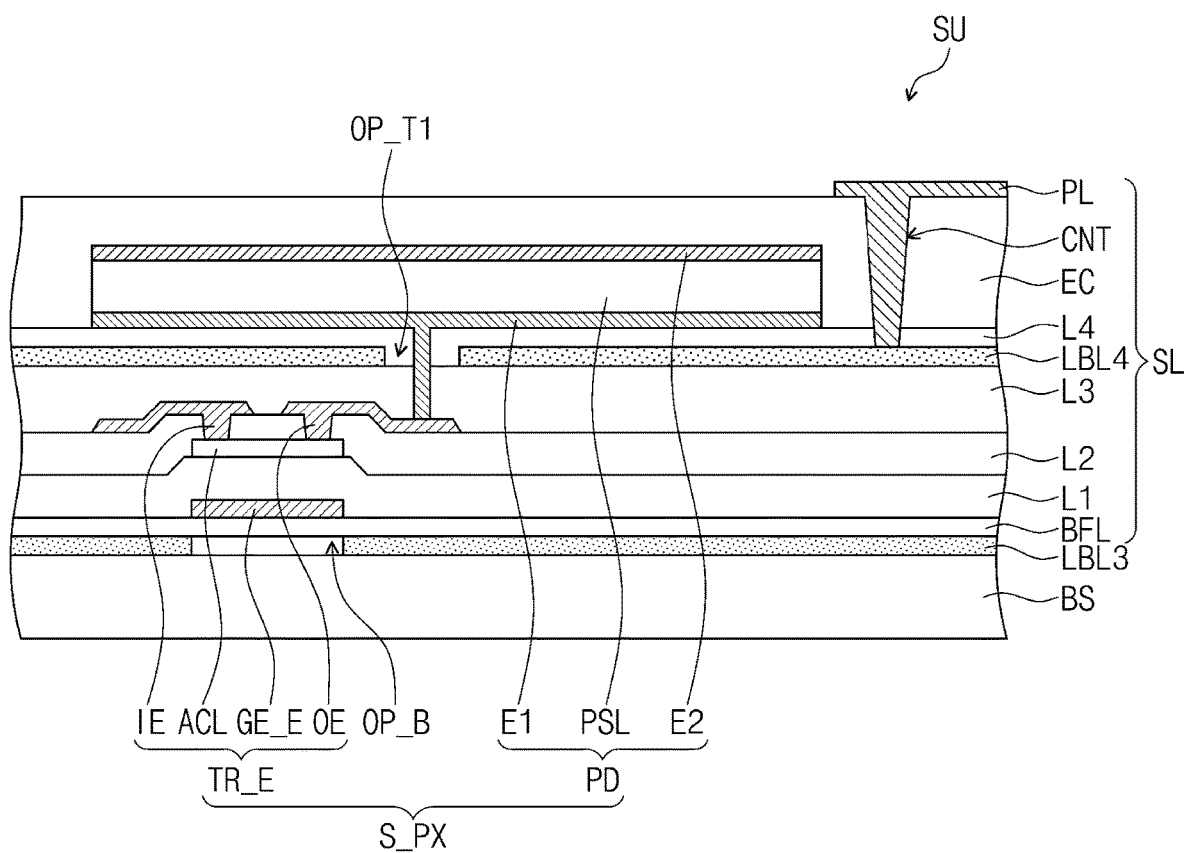
FIG. 10B is an enlarged cross-sectional view of an embodiment of a sensor unit constructed according to the principles of the invention.
Figure 11:
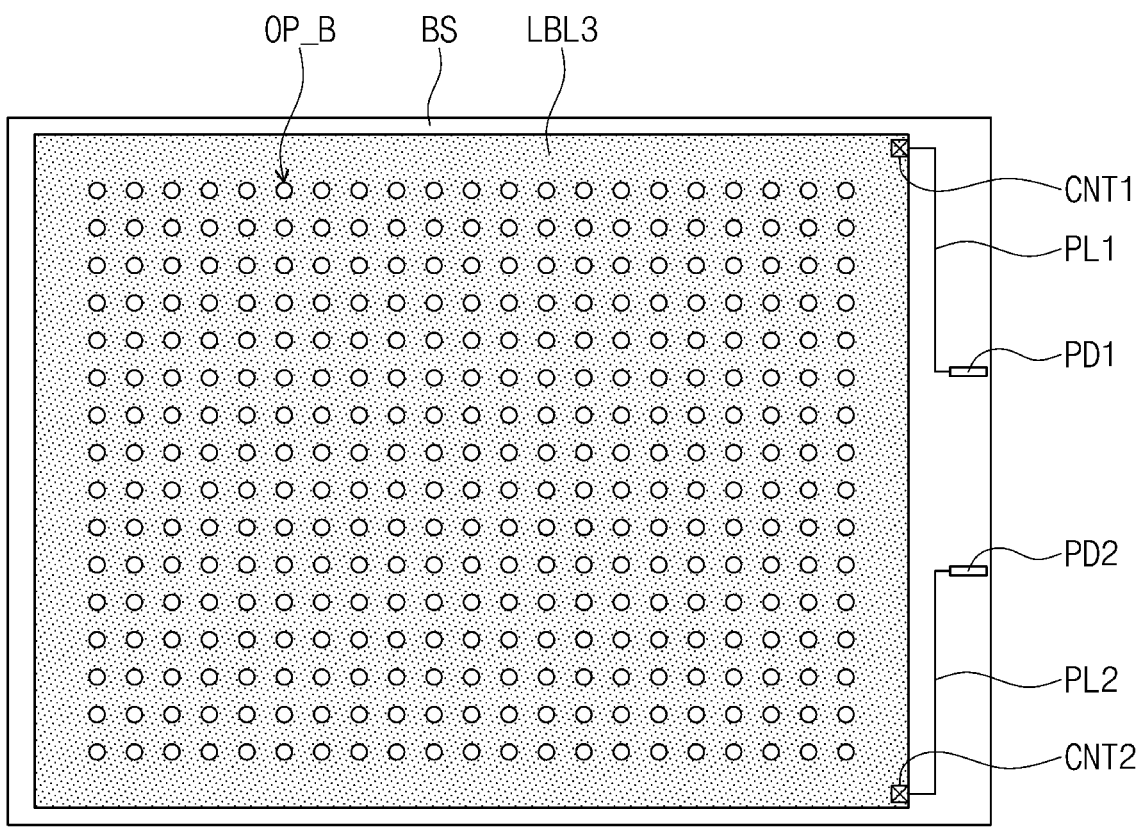
FIG. 11 is a plan view showing the light shielding layer and the power supply line shown in FIG. 10A.

FIGS. 10A and 10B are enlarged cross-sectional views of embodiments of a sensor unit constructed according to the principles of the invention. FIG. 11 is a plan view showing the light shielding layer and the power supply line shown in FIG. 10A. However, the same reference numerals are used for components identical to the components shown in FIGS. 5A, 5B, 8A, and 8B among components shown in FIGS. 10A and 10B and a detailed description thereof is omitted to avoid redundancy.

Referring to FIGS. 4, 10A and 11, the sensor unit SU includes a base board BS, a lower light shielding layer LBL3 and a sensing layer SL. The lower light shielding layer LBL3 is disposed on the base board BS, and the sensing layer SL is disposed on the lower light shielding layer LBL3. That is, the lower light shielding layer LBL3 is disposed between the base board BS and the sensing layer SL.

The lower light shielding layer LBL3 may block the external light Le incident from the rear surface of the base board BS from being provided to the sensing layer SL. As an embodiment, the lower light shielding layer LBL3 may include a metal material having high reflectance. That is, the lower light shielding layer LBL3 reflects the external light Le incident through the base board BS to block the external light Le from being provided to the sensing layer SL. The lower light shielding layer LBL3 may be provided in a size corresponding to the sensing layer SL. However, the embodiments are not limited thereto. For example, the lower light shielding layer LBL3 may be provided to partially overlap the sensing layer SL.

The sensing layer SL includes a plurality of sensing pixels S_PX. Each sensing pixel S_PX includes a sensor driving circuit and a detection element PD. The sensor driving circuit includes at least one transistor TR_E. The lower light shielding layer LBL3 may include a second opening part OP_B provided corresponding to at least one transistor TR_E.

As an embodiment, the transistor TR_E may have a bottom gate structure. Specifically, the transistor TR_E includes a control electrode GE_E, an active layer ACL, an input electrode IE, and an output electrode OE. The control electrode GE_E is disposed on the buffer layer BFL, and is covered by the first insulating layer L1. The active layer ACL is disposed on the first insulating layer L1 and overlaps the control electrode GE_E with the first insulating layer L1 therebetween. The control electrode GE_E may have a size corresponding to the active layer ACL. For example, the control electrode GE_E may have a size substantially equal to or greater than the active layer ACL. Therefore, when viewed from the back of the base board BS, the active layer ACL and the control electrode GE_E may be completely overlapped, and the active layer ACL may be obscured by the control electrode GE_E. The second insulating layer L2 is disposed on the active layer ACL. The second insulating layer L2 is disposed on the active layer ACL. The input electrode IE and the output electrode OE are disposed on the second insulating layer L2.

A second opening part OP_B of the lower light shielding layer LBL3 overlaps the control electrode GE_E. The second opening part OP_B of the lower light shielding layer LBL3 may have a size corresponding to the control electrode GE_E. For example, the second opening part OP_B of the lower light shielding layer LBL3 may have a size substantially equal to or smaller than that of the control electrode GE_E. Therefore, the second opening part OP_B of the lower light shielding layer LBL3 may completely overlap the control electrode GE_E.

When the sensor driving circuit includes a plurality of transistors TR_E, the lower light shielding layer LBL3 may include at least one opening part overlapping at least one of the plurality of transistors. That is, the lower light shielding layer LBL3 may include a plurality of opening parts each overlapping a plurality of transistors, and may include the opening parts overlapping some of the plurality of transistors.

As shown in FIG. 11, the second opening part OP_B may have a circular shape. However, the shape of the second opening part OP_B is not limited thereto. The second opening part OP_B may have a shape corresponding to the shape of the control electrode GE_E and the active layer ACL.

The lower light shielding layer LBL3 may be electrically connected to the power supply line PL to receive the light blocking voltage $V_{BL}$ (shown in FIG. 7A) from the power supply line PL. The connection structure of the lower light shielding layer LBL3 and the power supply line PL has been already described with reference to FIGS. 5A and 6 so that its description is omitted. As an embodiment, the power supply line PL in the sensing layer SL may be omitted. That is, when the second opening part OP_B is provided in the lower light shielding layer LBL3, the light blocking voltage $V_{BL}$ may not be applied to the lower light shielding layer LBL3.

Referring to FIG. 10B, the sensing layer SL may further include an upper light shielding layer LBL4. The upper light shielding layer LBL4 may be disposed to cover the sensor driving circuit of each sensing pixel S_PX. As an embodiment, the upper light shielding layer LBL4 may be disposed on the third insulating layer L3. The upper light shielding layer LBL4 is disposed on the transistor TR_E included in the sensor driving circuit so that light incident through the upper surface of the sensor unit SU may be prevented from being incident upon the active layer ACL of the transistor TR_E. As an embodiment, the upper light shielding layer LBL4 may include a metal material having high reflectivity or a black organic material capable of absorbing light. That is, the upper light shielding layer LBL4 may include the same material as the lower light shielding layer LBL3 or may include other materials.

The detection element PD may be disposed on the upper light shielding layer LBL4. The fourth insulating layer L4 may be further disposed between the upper light shielding layer LBL4 and the detection element PD. The upper light shielding layer LBL4 and the detection element PD may be insulated by the fourth insulating layer L4. The fourth insulating layer L4 may be omitted.

The detection element PD is disposed on the fourth insulating layer L4, and the first light detection electrode E1 of the detection element is connected to the output electrode OE of the transistor TR_E through a through hole provided in the third insulating layer L3 and the fourth insulating layer L4. The upper light shielding layer LBL4 may be provided with a first opening part OP_T1 corresponding to the through hole.

When the upper portion of the transistor TR_E is covered by the upper light shielding layer LBL4, the transistor TR_E may be disposed corresponding to the transmission part TP (refer to FIG. 4) of the optical system OS (refer to FIG. 4). That is, the transmission part TP of the optical system OS may be extended to the placement area of the transistor TR_E. As described above, when the transmission part TP is expanded, the area of the detection element PD in each sensing pixel S_PX may also be increased corresponding to the transmission part TP. In conclusion, as the transistor TR_E is covered by the upper light shielding layer LBL4, the area occupied by the detection element PD in each sensing pixel S_PX may be increased, and as a result, the overall sensing performance of the sensor unit SU may be improved.

The sensing layer SL may further include a power supply line PL for electrically connecting to the upper light shielding layer LBL4 to supply the light blocking voltage $V_{BL}$ (shown in FIG. 7A). The power supply line PL is disposed on the protection layer EC and is electrically connected to the upper light shielding layer LBL4. The power supply line PL may be connected to the upper light shielding layer LBL4 through a contact part CNT provided to pass through the protection layer EC and the fourth insulating layer L4. However, the position of the power supply line PL is not limited to this. For example, the power supply line PL may be disposed on the same layer as the first light detection electrode E1. In this case, the contact part CNT may be provided in the fourth insulating layer L4.

FIG. 10B shows a structure in which the lower light shielding layer LBL3 is not connected to the power supply line PL, but the lower light shielding layer LBL3 and the upper light shielding layer LBL4 may be commonly connected to the power supply line PL.

The lower and upper light shielding layers LBL3 and LBL4 may be commonly connected to one power supply line PL, but the embodiments are not limited thereto. That is, the lower and upper light shielding layers LBL3 and LBL4 may be connected to different power supply lines, respectively. In addition, when the lower and upper light shielding layers LBL3 and LBL4 are respectively connected to different power supply lines, light blocking voltages having the same voltage level or light blocking voltages having different voltage levels may be applied to the lower and upper light shielding layers LBL3 and LBL4, respectively.

Detection modules and display devices having the same constructed according to the principles and embodiments of the invention dispose a light shielding member, such as a light shielding layer, in the sensor unit to improve the problem of external light increasing the leakage current of a transistor included in the sensor driving circuit of the display device.

In addition, by applying a substantially constant light blocking voltage to the light shielding layer, it is possible to prevent the potential difference between the control electrode and the input electrode of the transistor from being increased to a certain level or higher due to a hysteresis phenomenon. That is, by preventing the driving performance of the transistor from deteriorating, it is possible to improve the sensing performance of the sensor unit and improve the overall reliability of the detection module.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A detection module, the detection module comprising:
    a substrate;
    a detector disposed on the substrate to detect an external signal;
    a sensor driving circuit disposed on the substrate to drive the detector; and
    a light shielding layer to block an external light from entering the sensor driving circuit and to receive a light blocking voltage,
    wherein the light shielding layer comprises:
    a lower light shielding layer disposed between the substrate and the sensor driving circuit; and
    an upper light shielding layer disposed on the sensor driving circuit, the upper light shielding layer comprising an opening part overlapping the detector.

2. The detection module of claim 1, wherein the sensor driving circuit comprises at least one transistor.

3. The detection module of claim 2, wherein the transistor comprises:
    an active layer;
    a control electrode disposed on the active layer and overlapping the active layer; and
    an input electrode and an output electrode spaced apart from each other on the control electrode, and
    wherein the lower light shielding layer is disposed between the active layer and the substrate.

4. The detection module of claim 2, wherein the transistor comprises:
    an active layer;
    a control electrode disposed under the active layer and overlapping the active layer; and
    an input electrode and an output electrode spaced apart from each other on the active layer, and
    wherein the lower light shielding layer is disposed between the control electrode and the substrate.

5. The detection module of claim 4, wherein the lower light shielding layer comprises an opening at least partially overlapping the control electrode.

6. The detection module of claim 1, further comprising a power supply line to supply the light blocking voltage to the light shielding layer, the light blocking voltage being a ground voltage or a substantially constant voltage.

7. The detection module of claim 1, wherein at least one of the lower light shielding layer or the upper light shielding layer is configured to receive the light blocking voltage.

8. The detection module of claim 7, wherein the sensor driving circuit comprises at least one transistor, and
wherein the detector overlaps the transistor.

9. The detection module of claim 8, wherein the transistor comprises:
an active layer;
a control electrode disposed on the active layer and overlapping the active layer; and
an input electrode and an output electrode spaced apart from each other on the active layer, and
wherein the opening part overlaps a position where the output electrode of the transistor and the detector are connected.

10. The detection module of claim 1, wherein an area of the lower light shielding layer is larger than an area of the upper light shielding layer.

11. The detection module of claim 1, wherein the detector comprises a detection element including a photoelectric conversion element.

12. The detection module of claim 11, further comprising an optical system including a plurality of transmission parts and a light absorbing part provided around the plurality of transmission parts,
wherein the detection element is disposed under the optical system to receive light passing through the plurality of transmission parts.

13. A display device comprising:
a display module including a light emitting element to generate light, and a display panel to display an image using the light; and
a detection module disposed under the display module to receive an external signal,
wherein the detection module comprises:
a substrate;
a detector disposed on the substrate to detect the external signal;
a sensor driving circuit disposed on the substrate to drive the detector; and
a light shielding layer to block an external light from entering the sensor driving circuit and to receive a light blocking voltage,
wherein the light shielding layer comprises:
a lower light shielding layer disposed between the substrate and the sensor driving circuit; and
an upper light shielding layer disposed on the sensor driving circuit, the upper light shielding layer comprising an opening part overlapping the detector.

14. The display device of claim 13, wherein the sensor driving circuit comprises at least one transistor.

15. The display device of claim 14, wherein the transistor comprises:
an active layer;
a control electrode disposed on the active layer and overlapping the active layer; and
an input electrode and an output electrode spaced apart from each other on the control electrode, and
wherein the lower light shielding layer is disposed between the active layer and the substrate or between the control electrode and the substrate.

16. The display device of claim 14, wherein the light blocking voltage is applied to at least one of the lower light shielding layer or the upper light shielding layer.

17. The display device of claim 13, wherein the sensor driving circuit comprises at least one transistor connected to the detector,
wherein the transistor comprises:
an active layer;
a control electrode disposed on the active layer and overlapping the active layer; and
an input electrode and an output electrode spaced apart from each other on the active layer, and
wherein the opening part is provided corresponding to a position where the output electrode of the transistor and the detector are connected.

18. The display device of claim 17, wherein an area of the lower light shielding layer is larger than an area of the upper light shielding layer.

19. The display device of claim 13, wherein the detector comprises a detection element including a photoelectric conversion element.

20. The display device of claim 19, wherein the detection module further comprises an optical system including a plurality of transmission parts and a light absorbing part provided around the plurality of transmission parts, and
wherein the detection element and the sensor driving circuit overlap the plurality of transmission parts.

21. An electronic device comprising:
a display module including a light emitting element to generate light, and a display panel to display an image using the light;
a detection module disposed under the display module to receive an external signal; and
a housing accommodating the display module and the detection module,
wherein the detection module comprises:
a substrate;
a detector disposed on the substrate to detect the external signal;
a sensor driving circuit disposed on the substrate to drive the detector; and
a light shielding layer to block an external light from entering the sensor driving circuit and to receive a light blocking voltage,
wherein the light shielding layer comprises:
a lower light shielding layer disposed between the substrate and the sensor driving circuit; and
an upper light shielding layer disposed on the sensor driving circuit, the upper light shielding layer comprising an opening part overlapping the detector.

* * * * *